(12) United States Patent
Nauta

(10) Patent No.: US 8,150,355 B2
(45) Date of Patent: Apr. 3, 2012

(54) RADIO RECEIVER

(75) Inventor: Hendrikus C. Nauta, Den Haag (NL)

(73) Assignee: NXP B.V., Eindhoven (NL)

( * ) Notice: Subject to any disclaimer, the term of this patent is extended or adjusted under 35 U.S.C. 154(b) by 778 days.

(21) Appl. No.: 12/282,459

(22) PCT Filed: Mar. 8, 2007

(86) PCT No.: PCT/IB2007/050777
§ 371 (c)(1),
(2), (4) Date: Sep. 10, 2008

(87) PCT Pub. No.: WO2007/105152
PCT Pub. Date: Sep. 20, 2007

(65) Prior Publication Data
US 2009/0033424 A1 Feb. 5, 2009

(30) Foreign Application Priority Data
Mar. 10, 2006 (EP) ..................................... 06110981
Dec. 22, 2006 (EP) ..................................... 06127035

(51) Int. Cl.
*H04B 1/18* (2006.01)
(52) U.S. Cl. ........ 455/280; 455/130; 455/133; 455/324; 455/213; 375/324; 375/328; 375/316
(58) Field of Classification Search .................. 455/280, 455/130, 133, 324, 213, 214, 302; 375/324, 375/328, 316
See application file for complete search history.

(56) References Cited

U.S. PATENT DOCUMENTS

| 6,539,066 B1 * | 3/2003 | Heinen | 375/334 |
| 7,092,461 B1 * | 8/2006 | Minnis et al. | 375/329 |
| 7,120,415 B2 * | 10/2006 | Minnis et al. | 455/324 |

FOREIGN PATENT DOCUMENTS

WO 03065602 A 8/2003

OTHER PUBLICATIONS

Neugebauer T C et al; "Parasitic Capacitance Cancellation in Filter Inductors". Power Electronics Specialists Conference, 2004. PESC 04. 2004 IEEE 35TH Annual. Aachen, Germany, Jun. 20-25, 2004. Piscataway, NJ, USA, IEEE, US. pp. 3102-3107.

(Continued)

*Primary Examiner* — Tuan Pham

(57) ABSTRACT

There is provided a method that comprises identifying a parasitic signal transfer in a filter using a signal-directed graph; and adding compensation paths to the filter to reduce or eliminate the effect of the parasitic signal transfer A corresponding filter is provided which comprises a plurality of amplifier stages that generate one or more filter poles; at least one component coupled to at least one of the amplifier stages, the component causing a parasitic effect in the filter; and means for applying a compensation current to the at least one amplifier stage to reduce or eliminate the parasitic effect. A radio receiver is further provided that comprises a filter for receiving and filtering in-phase and quadrature signals; an amplifier for receiving and amplifying one of said filtered in-phase and quadrature signals; means for receiving the amplified and filtered in-phase or quadrature signal from said amplifier, and for regenerating the other one of said in-phase and quadrature signals from said amplified and filtered signal.

7 Claims, 16 Drawing Sheets

OTHER PUBLICATIONS

Hitoshi Watanabe et al; "Soul of Circuit Theory—A Review on Research Activities of Graphs and Circuits in Japan". IEEE Transactions on Circuits and Systems I: Fundamental Theory and Applications, IEEE Inc, New York, US. vol. 45, No. 1, Jan. 1999. The Whole Document.

Brian Guthrie et al; "A CMOS Gyrator Low-IF Filter for a Dual-Mode Bluetooth/Zigbee Transceiver". IEEE Journal of Solid-State Circuits, vol. 40, No. 9, Sep. 2005, p. 1872-1879.

Fang S J et al; "An Image-Rejection Down-Converter for Low-IF Receivers". IEEE Transactions on Microwave Theory and Techniques, vol. 53, No. 2, Feb. 2005. pp. 478-487.

* cited by examiner

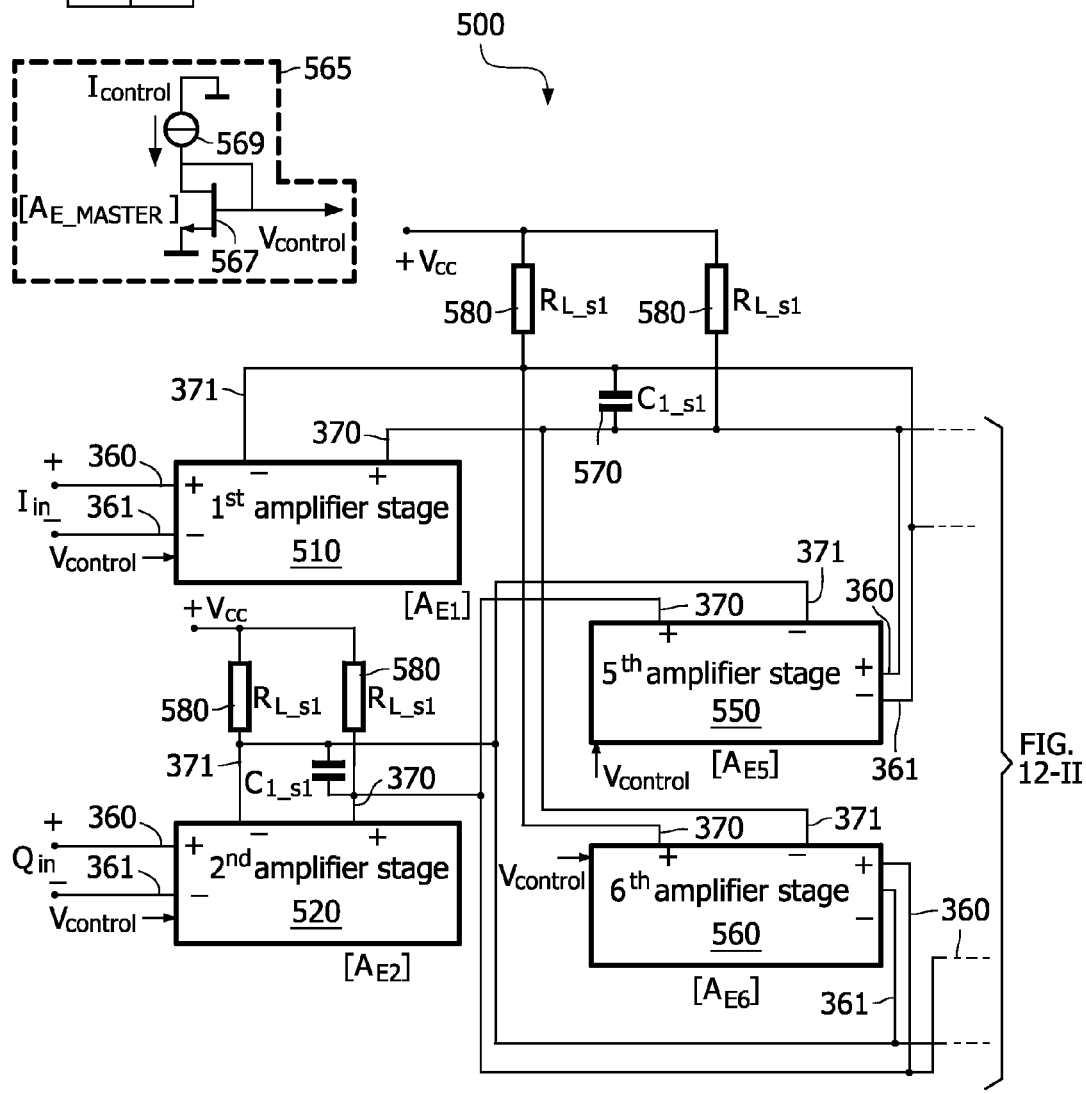
FIG. 12-I

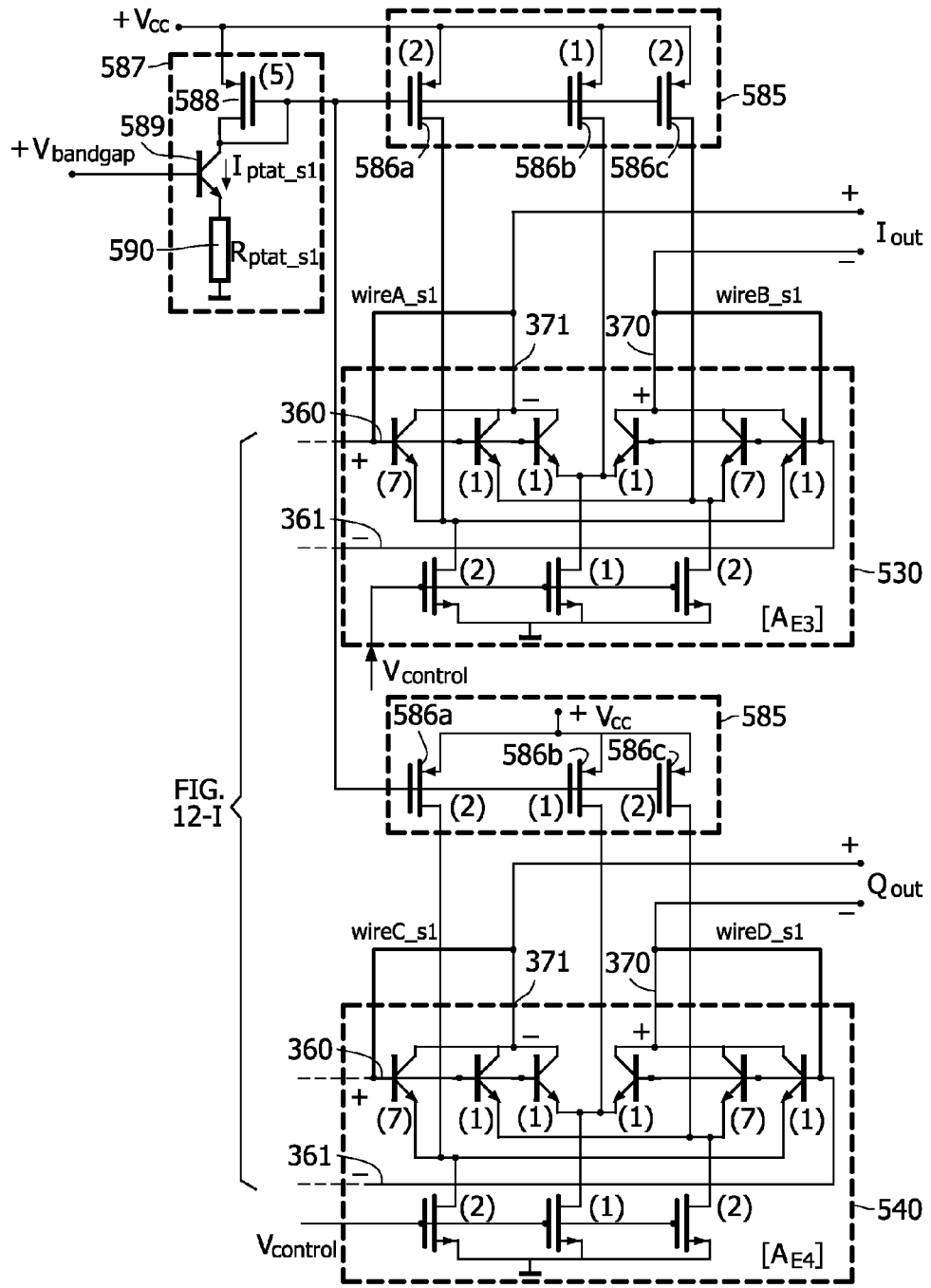
FIG. 12-II

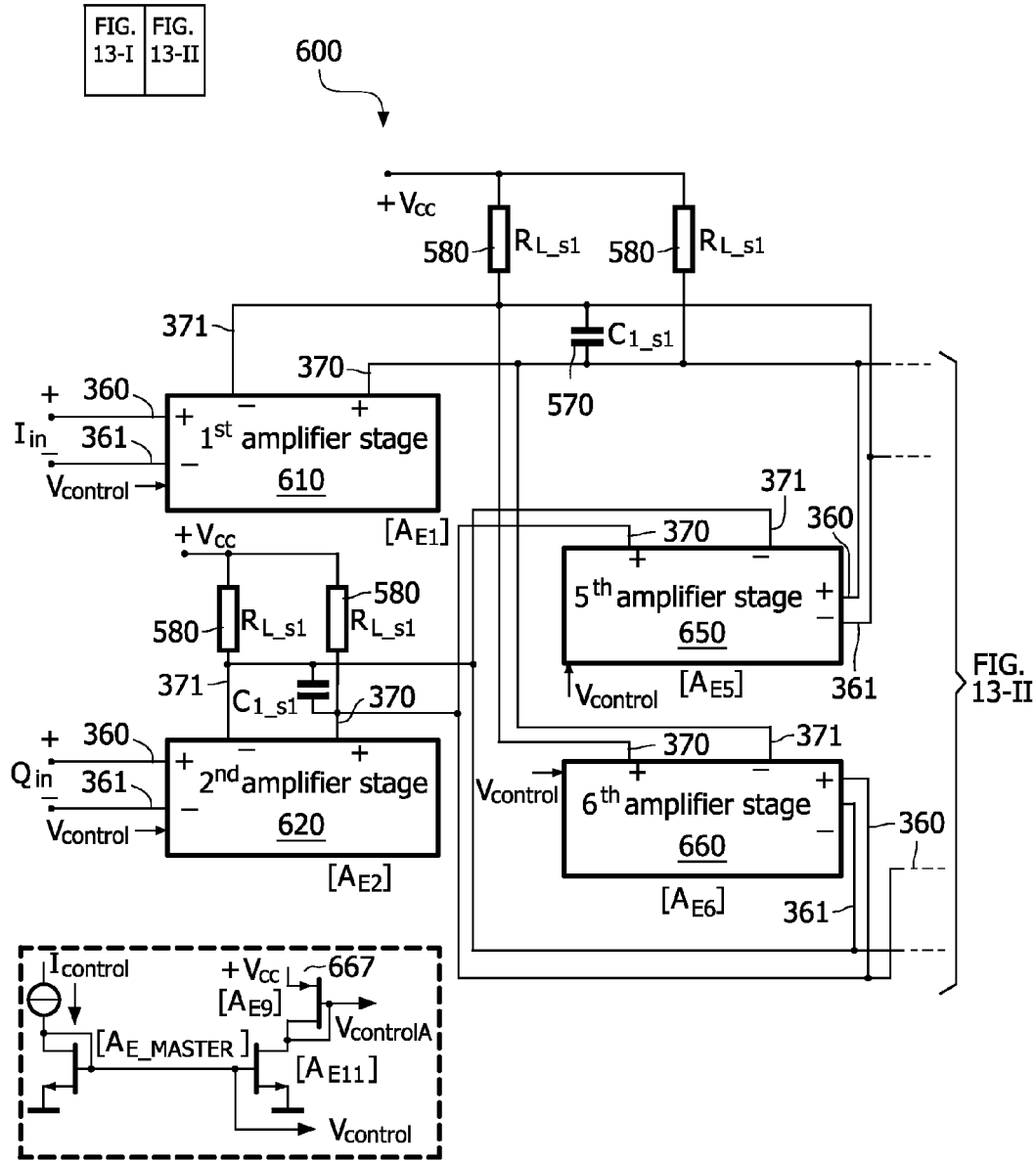
FIG. 13-I

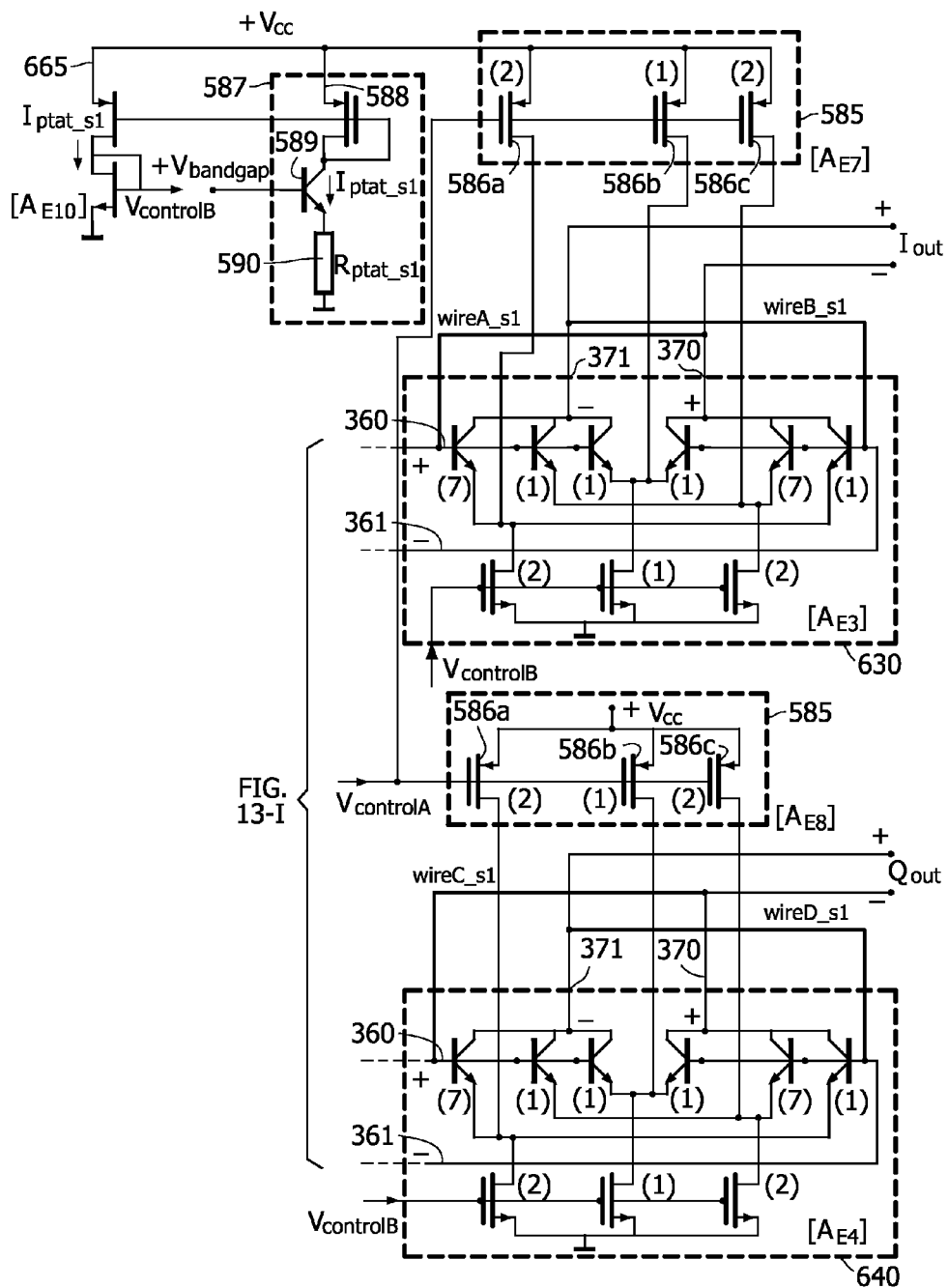
FIG. 13-II

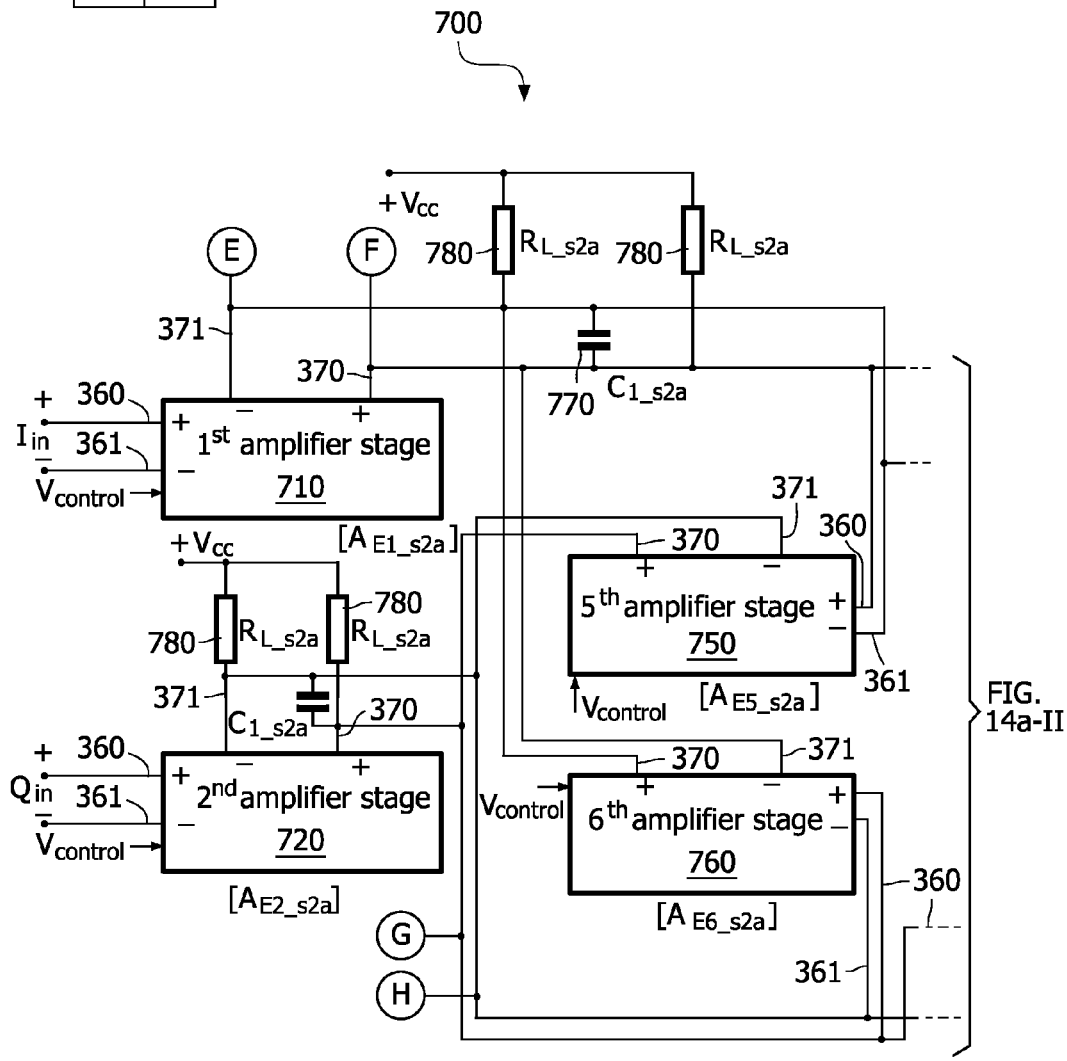
FIG. 14a-I

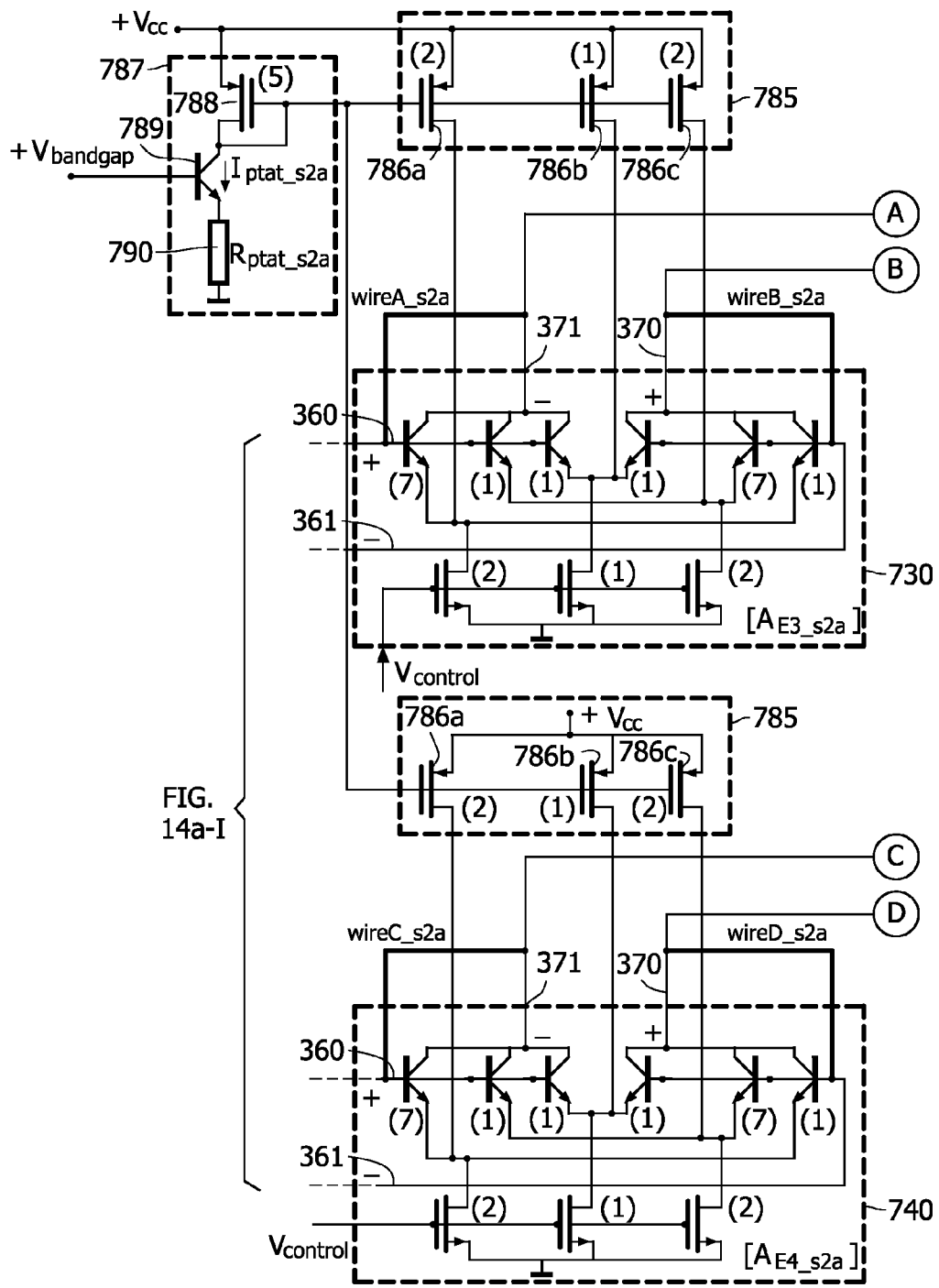
FIG. 14a-II

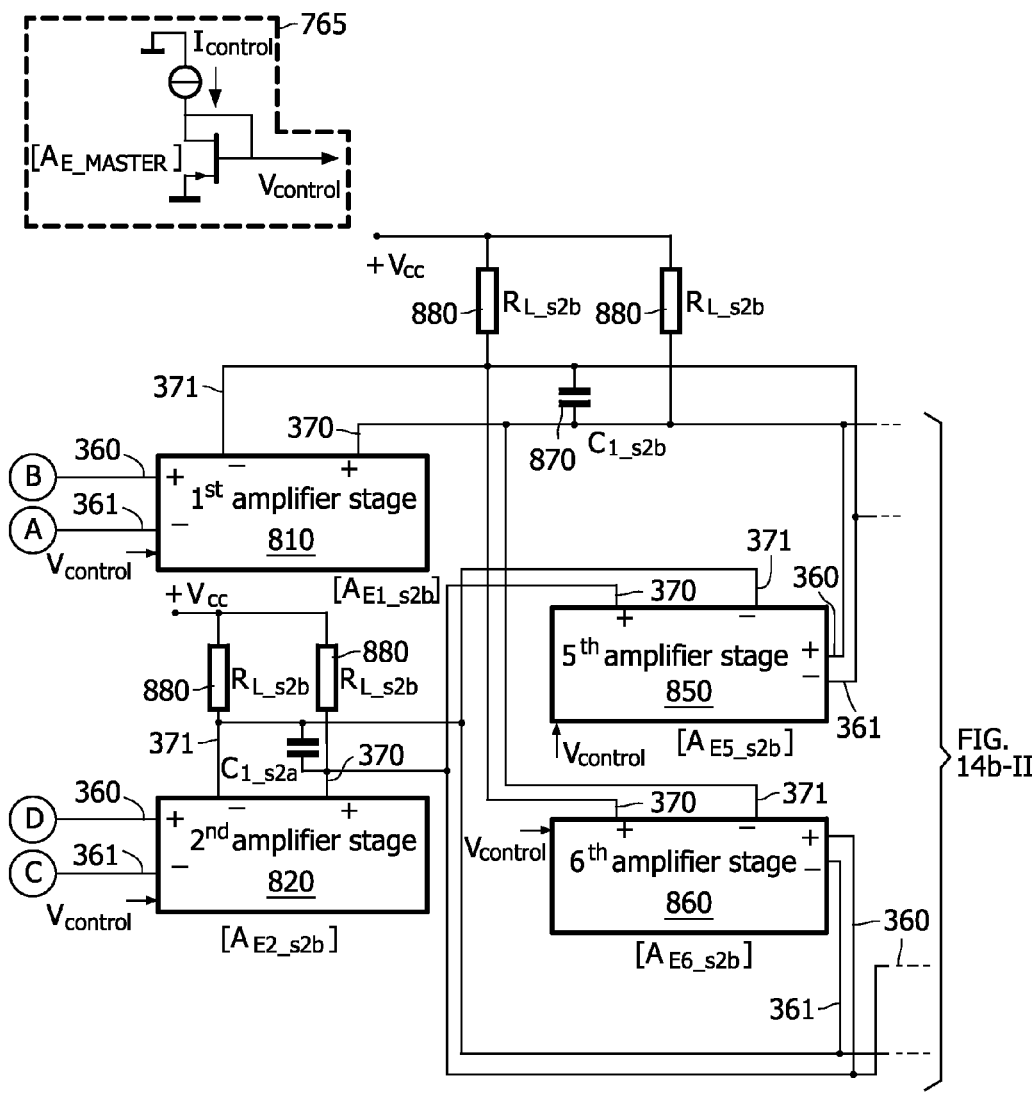
FIG. 14b-I

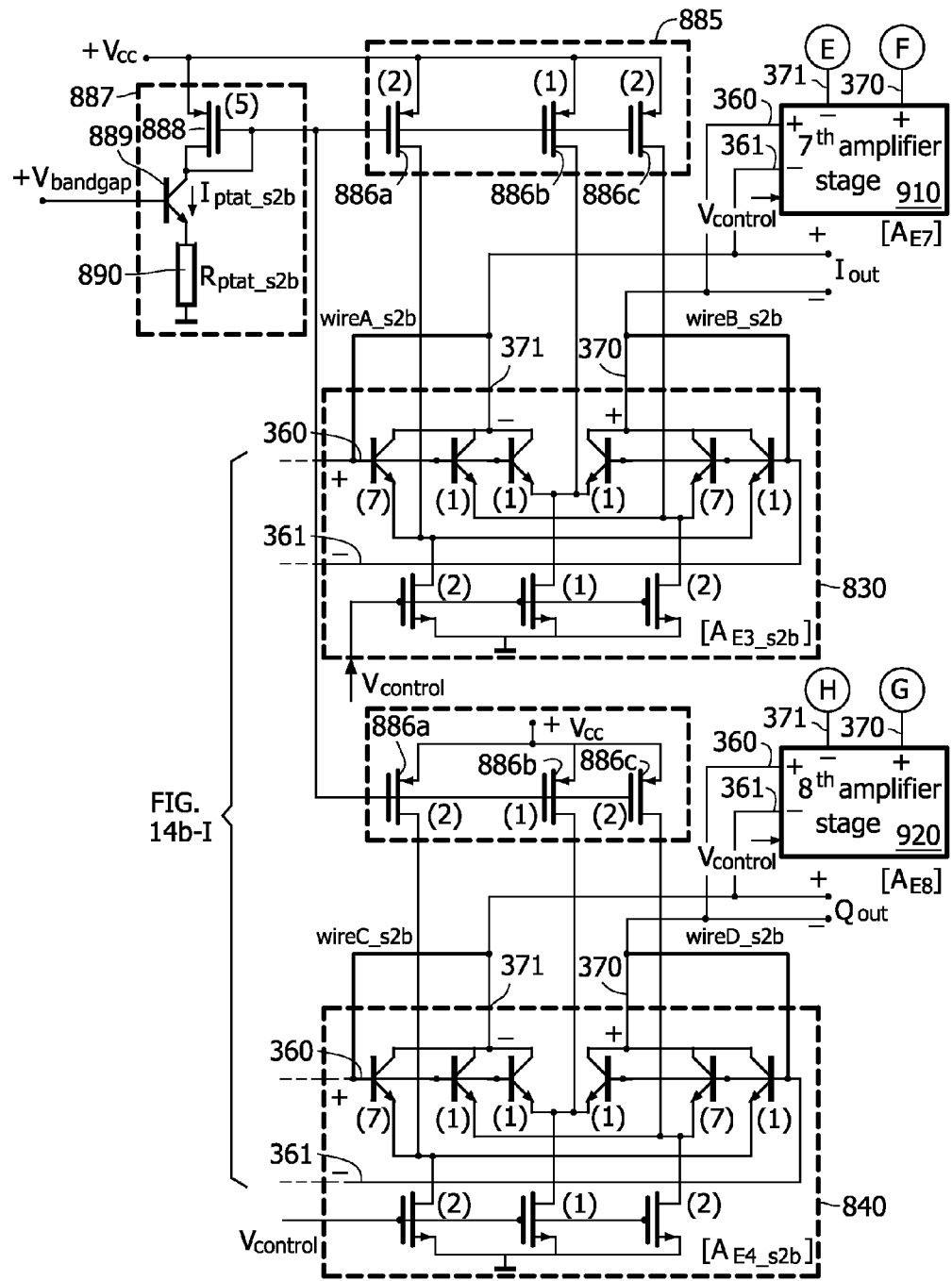
FIG. 14b-II

RADIO RECEIVER

TECHNICAL FIELD OF THE INVENTION

This invention relates to a radio receiver, and in particular to a silicon integrated radio receiver and components therefor.

BACKGROUND TO THE INVENTION

In a wireless radio receiver, an incoming high-frequency radio signal, such as an FM radio signal, is converted into a signal with an intermediate frequency (IF), which is then amplified and passed to a demodulator which retrieves information, such as baseband audio, from the radio signal.

Modern integrated FM receivers preferably realize channel selectivity at low IF frequencies. As an example, in FIG. 1 the back-end of such an integrated FM radio receiver is shown. This back-end consists of the IF part and the demodulator of such an integrated radio receiver. The FM receiver back-end 10 comprises a complex IF filter 12 which receives a complex input signal having separate in-phase (I) and quadrature (Q) component signals and which is used for adequate image suppression. In other words, the filter 12 only has a pass band at the positive IF frequency or the negative IF frequency.

In combination with an image-rejecting complex mixer in front of this filter 12, the image frequency caused by the mixer will be suppressed by the selectivity curve of the complex filter. Since the image channel is very close to the desired channel for low-IF receivers, the image rejection is merely realized in the combination of the image-rejecting mixer with the complex filter.

Respective IF limiting amplifiers 14, 16 are provided for each of the I and Q signals output from the complex IF filter 12, which either linearly or non-linearly amplify the signals. The I and Q signals from the IF limiters 14, 16 are then used to drive a complex FM demodulator 18. The complex demodulator 18 (using I and Q input signals) is preferred for its suppression of spurious responses at $2\omega_{IF}$, where $\omega_{IF}$ represents the radian IF centre frequency.

In many cases RSSI information is required in the receiver. For instance, the RSSI information can be used in the channel-search algorithm in the tuning system of the receiver. The RSSI information is derived from each of the I and Q signals from the respective IF limiters 14, 16 and provided at an output-RSSI-out 20.

The complex demodulator 18 comprises a complex demodulator filter 22, respective phase detectors 24, 26 for the I and Q signals output from the complex demodulator filter 22, and a summing block 28 for combining the outputs of the two phase detectors 24, 26.

After the demodulator 18, a low-pass filter 30 is provided to prevent spurious signals around harmonics of 38 kHz being mixed down to audible "birdies" in a subsequent stereo decoder.

However, the requirement for respective IF limiters for each of the in-phase and quadrature signals increases the on-chip area needed to implement the integrated radio receiver.

Where an active real or complex filter in a radio receiver has large tolerances as a result of the components in the filter, it is desirable to be able to accurately identify and fix the filter response.

It is known to achieve this by using a reference signal that has an accurate radian frequency $\omega_{ref}$ which serves as a basis to tune all time constants in the filter to their desired values. For this purpose the time constants in the filter need to be tunable with a control signal $X_s$, for instance by regulating the transconductances (resistors) in the filter or by tuning the capacitors in the filter by using varactors. The filter to be fixed is referred to as the main filter.

In order to obtain the control signal to tune all of the time constants in the main filter, a master filter is used which closely matches the time constants in the main filter. Commonly used master filters use a low-order filter like a single pole complex filter or a two pole real filter. In a control loop, the centre frequency of the master filter is tuned to be equal to the accurate reference radian frequency ($\omega_{ref}$, thereby generating a control signal $X_s$. This control signal will also be used in the main filter to accurately tune all of the time constants to their desired values, thereby realizing an accurate filter response.

However, due to parasitic effects in the main filter, the time constants may not linearly scale to the master filter. This is especially true in the general situation where the pole positions of the main filter are located at different positions compared to the low-order master filter. This non-linear scaling will result in an error in the pole positions and gain of the main filter.

It is therefore an object of the invention to accurately fix the filter response of an active real- or complex-filter, even when there are large tolerances in the filter components.

SUMMARY OF THE INVENTION

In accordance with a first aspect of the invention, there is provided a method comprising identifying a parasitic signal transfer in a filter using a signal-directed graph; and adding compensation paths to the filter to reduce or eliminate the effect of the parasitic signal transfer.

In accordance with a second aspect of the invention, there is provided a filter comprising a plurality of amplifier stages that generate one or more filter poles; at least one component coupled to at least one of the amplifier stages, the component causing a parasitic effect in the filter; and means for applying a compensation current to the at least one amplifier stage to reduce or eliminate the parasitic effect.

In accordance with a third aspect of the invention, there is provided a radio receiver comprising a filter for receiving and filtering in-phase and quadrature signals; an amplifier for receiving and amplifying one of said filtered in-phase and quadrature signals; means for receiving the amplified and filtered in-phase or quadrature signal from said amplifier, and for regenerating the other one of said in-phase and quadrature signals from said amplified and filtered signal.

According to a fourth aspect of the invention, there is provided a method of processing an IF signal, the method comprising receiving and filtering in-phase and quadrature signals; amplifying one of said filtered in-phase and quadrature signals whilst terminating the other one of said filtered signals; regenerating the other one of said filtered signals from the amplified signal.

These and other aspects of the invention will be apparent from and elucidated with reference to the embodiments described hereinafter.

BRIEF DESCRIPTION OF THE DRAWINGS

The invention will now be described, by way of example only, with reference to the following drawings, in which:

FIG. 12 is a circuit diagram of a first order complex filter section in accordance with the invention;

FIG. 13 is a circuit diagram of an alternative first order complex filter section in accordance with the invention; and FIGS. 14a and 14b are a circuit diagram of a second order complex filter section in accordance with the invention.

DETAILED DESCRIPTION OF THE PREFERRED EMBODIMENTS

Figure 1:
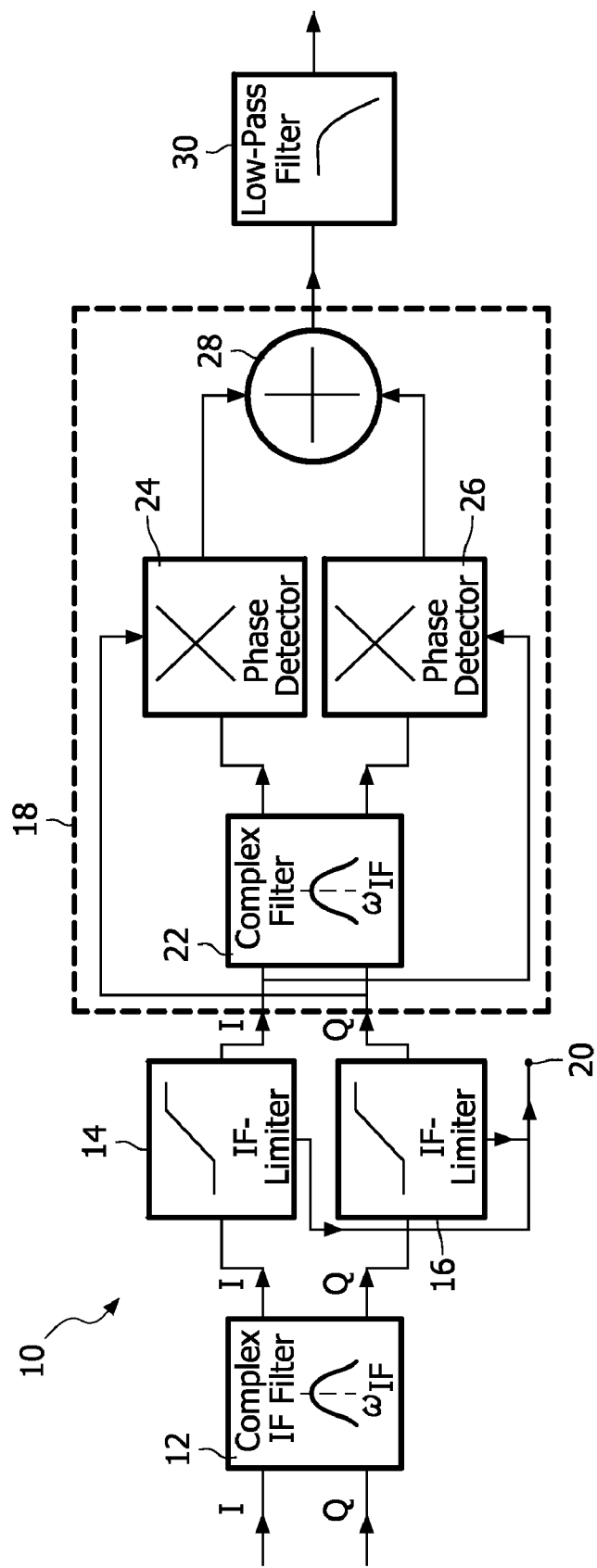
FIG. 1 shows the back-end of a conventional radio receiver.
Figure 2:
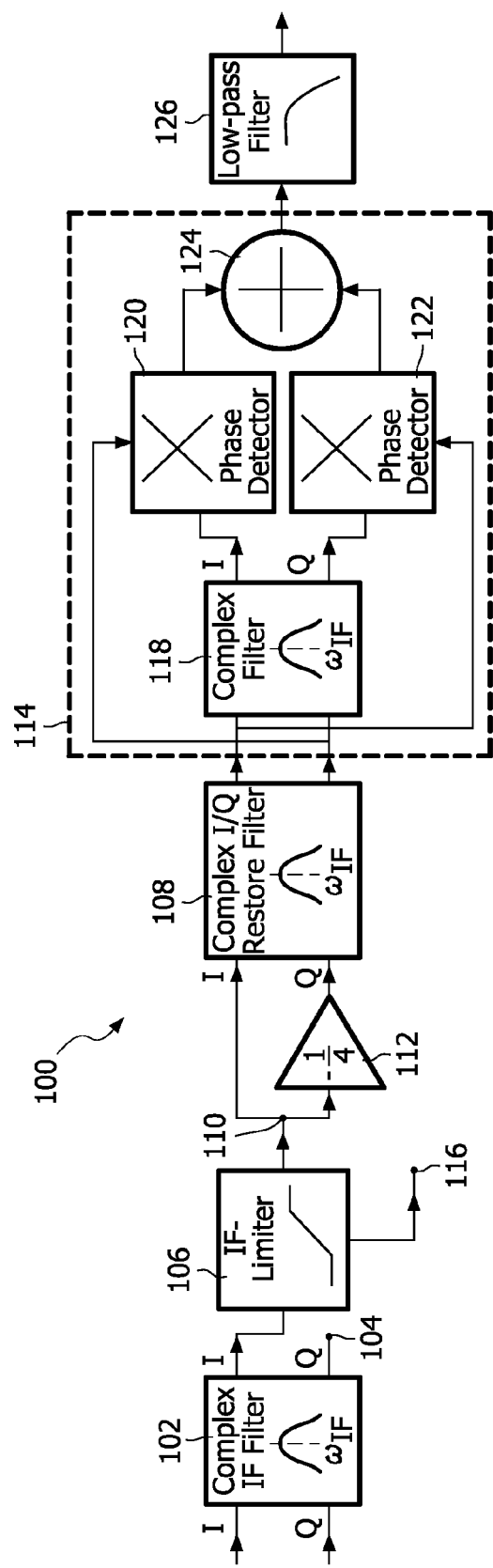
FIG. 2 shows the back-end of a radio receiver having a single IF limiting amplifier.

A preferred radio receiver back-end 100 is shown in FIG. 2. As with the radio receiver back-end of FIG. 1, the radio receiver back-end 100 comprises a complex IF filter 102 which receives I and Q input signals and which is used to for adequate image suppression.

However, in this radio receiver 100, only one of the outputs of the complex IF filter 102 is passed to an IF limiting amplifier. In this illustrated receiver 100, the Q signal output from the complex IF filter 102 is terminated at point 104. Only the I signal output from the complex filter 102 is passed to an IF limiting amplifier 106. The IF limiting amplifier 106 is provided to either linearly or non-linearly amplify the input signal.

After the single limiting amplifier 106, the I and Q relationship is restored by a complex restore filter 108. Specifically, the output from the limiting amplifier 106 is split at point 110 into a signal (which becomes the I component) that passes directly into the restore filter 108 and into a signal (and which becomes the Q component) that passes into the restore filter 108 via a component 112. The component 112 multiplies the output of the IF limiter 106 by $-\frac{1}{4}$. The operation of the component 112 provides the best system specification results in terms of stereo channel separation and audio distortion.

It will be appreciated that although the complex restore filter 108 and component 112 are shown as separate elements, the functions of both can be implemented in a single element.

The restored I and Q signals from the IF restore filter 108 is then used to drive a complex FM demodulator 114. The complex demodulator 114 suppresses spurious responses at $2\omega_{IF}$, where $\omega_{IF}$ represents the radian IF centre frequency.

Again, RSSI information might be required by the receiver, for instance in the channel-search algorithm of the receiver. Therefore, RSSI information is derived for the I signal from the IF limiter 106 and provided at an output-RSSI-out 116.

As in the receiver back-end of FIG. 1, the complex demodulator 114 comprises a complex demodulator filter 118, respective phase detectors 120, 122 for the I and Q signals output from the complex demodulator filter 118, and a summing block 124 for combining the outputs of the two phase detectors 120, 122. After the demodulator 114, a low-pass filter 126 is provided to prevent spurious signals around harmonics of 38 kHz being mixed down to audible birdies in a subsequent stereo decoder.

By only processing one of the I and Q signals after the complex IF filter 102, the radio receiver back-end 100 has a number of advantages over the receiver 10 in FIG. 1.

In particular, there is only one IF limiting amplifier 106 required after the IF filter 102 which reduces the chip area required to implement the receiver back-end 100. This also means that it is not necessary to balance the I and Q signals in the limiter paths and therefore there are less demands on the gain tolerances of the amplifier 106. The gain tolerance is predominantly dictated by the requested accuracy of the RSSI that is extracted out of the single limiting amplifier 106 and by the position of the "natural mute" curve as a function of the antenna level. The natural mute curve refers to the situation at lower antenna signal levels where the signal-to-noise ratio is poor, and the audio level intentionally drops.

In addition, the demands on the noise produced by the I/Q restore filter 108 are low. Thus, a smaller chip area is required.

The I/Q restore filter 108 not only restores the I and Q signals to drive the demodulator filter 118, but it also filters out the higher harmonics of the IF signal which are predominant at the output of the limiter 106. These higher harmonics can easily result in spurious responses from the complex demodulator 114 which could result in audible whistles or birdies in the subsequent stereo decoder.

Due to the filtering performed by the I/Q restore filter 106, the complex demodulator filter 118 can be better optimized in the complete chain of elements to obtain a lower audio distortion (mono and stereo) in the receiver.

Finally, the receiver back-end 100 has the advantage that there are less filtering demands on the anti-birdie filter 126.

In this receiver back-end 100, the filter responses of the IF filter 102, the I/Q restore filter 108, the filter 118 in the complex demodulator 114 and the anti-birdie filter 126 can be optimized in the complete cascade in such a way that a robust FM stereo receiver is obtained that has highly reproducible specifications, even under worse-case tolerance conditions of the components used in an IC process. For example, the filter curves do not have to be optimized individually so that each has a flat group-delay or a low-ripple group-delay in an attempt to minimize the audio distortion. Only the overall group-delay, including the parasitic effects of the higher harmonics of the limited IF signal, is optimized to obtain an acceptable audio distortion and stereo channel separation. Likewise, other parameters such as the IF selectivity in combination with stereo channel separation are optimized by taking the complete receiver chain into account.

A realization of low frequency complex IF filters in accordance with the invention, such as complex filter 102, complex restore filter 108 and complex demodulator filter 118 in the radio receiver back-end 100 will now be described further.

In general, a complex filter can be thought of as a frequency shift of a baseband prototype filter at a radian frequency $\omega_{bc}=0$ to a positive radian frequency of $+\omega_c$ or to a negative radian frequency of $-\omega_c$.

Figures 3, 4:
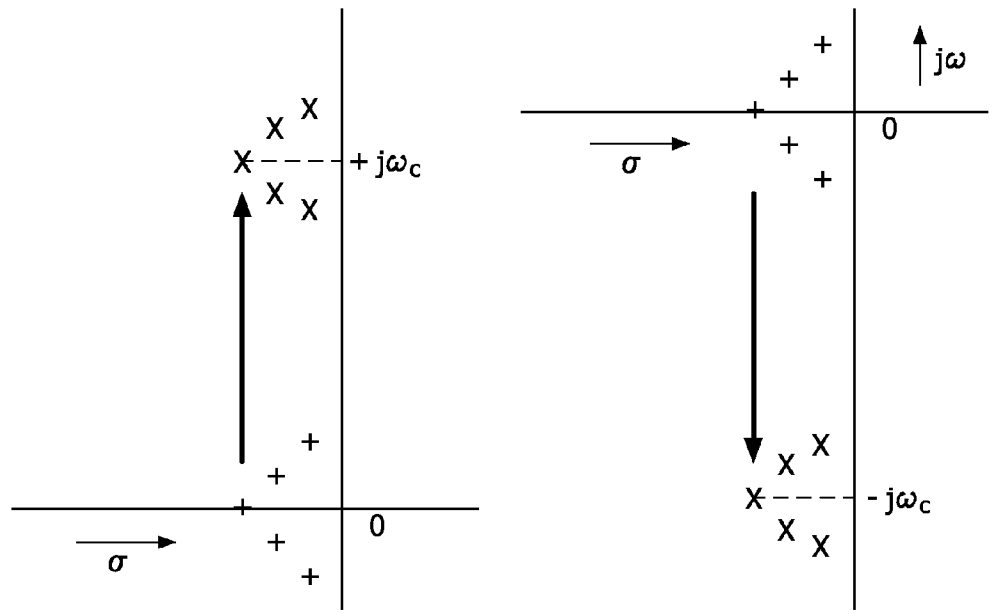
FIG. 3 illustrates the translation from baseband filter poles to positive complex filter poles.
FIG. 4 illustrates the translation from baseband filter poles to negative complex filter poles.

These translations are illustrated in FIGS. 3 and 4. In both Figures, the baseband filter poles are represented by the symbol '+', and the complex filter poles are represented by the symbol 'x'. As can be seen, the filter in FIG. 3 passes positive frequencies and therefore shifts the poles from 0 to $+j\omega_c$ while the filter in FIG. 4 passes negative frequencies and therefore shifts the poles from 0 to $-j\omega_c$.

The complex filter can comprise a cascade of filter sections, each section realizing either a complex pole pair, or one complex pole at or around the centre frequency. The centre frequency will be $+\omega_c$ when the filter has its pass band at positive frequencies, or $-\omega_c$ when the filter has its pass band at negative frequencies. A complex filter section with one complex pole pair originates from a complex pole pair in the equivalent baseband filter. Likewise a complex filter section with only one complex pole originates from a baseband filter with a real pole at the negative real axis.

As an example, the complex filter poles as shown in FIG. 3 (illustrated by 'x's) are realized by a cascade of 3 filter sections, one of the filter sections realizing only one complex pole at $\omega_c$ and the other two filter sections each realizing two complex poles around $\omega_c$.

Clearly, the poles need to be accurately fixed to realize an accurate filter response. Since each pole position is fundamentally related to a time constant, all time constants present in the filter should be accurate. In most cases, the on-chip components that influence and produce the time constant are not accurate enough to realize an adequate filter that can serve as a low-IF filter in integrated radio receiver applications.

For this reason, each individual filter pole or complex pole pair needs to be tuned to their desired positions by a control loop which uses an off-chip accurate external timing information source as a reference, such as a reference frequency $\omega_{ref}$.

Essentially, each complex pole n (where $n=0, 1, 2 \ldots n_{max}$, and $n_{max}$ is the number of poles in the filter) located at $s_n = \sigma_n + j\omega_n$ in the filter can be considered to be related to two individual time constants. The first time constant is related to $1/\omega_n$ and the other is related to $1/\sigma_n$.

It is assumed that each individual time constant is a perfectly scaled copy of a so-called master time constant $(R_{master} \cdot C_{master})$ and that all of these time constants are simultaneously controlled by one control signal $X_{control}$, or $$\tau_{n\_a} = 1/\sigma_n = k_{n\_a} \cdot X_{control} \cdot R_{master} \cdot C_{master} \quad (1)$$

$$\tau_{n\_b} = 1/\omega_n = k_{n\_b} \cdot X_{control} \cdot R_{master} \cdot C_{master} \quad (2)$$

for $n=0, 1, 2 \ldots n_{max}$.

To perfectly adjust all time constants to their desired values, it is only required to force the value of only one time constant $X_{control} \cdot R_{master} \cdot C_{master}$ to be equal to an accurate reference time constant or the equivalent inverse of an accurate frequency. This is achieved by a control loop that controls the value of $X_{control}$. A way to achieve this goal is by using only one single-pole complex master filter with its pole as a perfectly scaled version of the main filter poles at position $s_{master}$, thus:

$$\tau_{master\_a} = 1/\sigma_{master} = k_{master\_a} \cdot X_{control} \cdot R_{master} \cdot C_{master} \quad (3)$$

$$\tau_{master\_b} = 1/\omega_{master} = k_{master\_b} \cdot X_{control} \cdot R_{master} \cdot C_{master} \quad (4)$$

There is now the choice to either measure $\tau_{master\_a}$ associated with the damping of the pole or $\tau_{master\_b}$ associated with the frequency location of the pole.

It is common practice to measure the value of $\omega_{master} = 1/\sigma_{master\_b}$ as this is the easiest method to implement.

In order to measure this parameter and compare it with the external accurate frequency $\omega_{ref}$ to derive the control signal $X_{control}$ there are two main possibilities.

Firstly, the filter can be part of a frequency-controlled oscillator circuit. In this case, the frequency of oscillation is forced to be equal to the accurate external reference frequency $\omega_{ref}$ by using a phase-locked loop. The signal is thus extracted from the signal that drives the master filter.

Alternatively, the external reference signal can be the input signal to the master filter. In a control loop, the phase difference between the output signal of the filter and the input signal is forced to be zero by adjusting the value of the control signal $X_{control}$ to the master filter.

Assuming that a linear oscillator is used (for example a sine wave oscillator) both methods will give comparable levels of accuracy.

Unfortunately, a linear voltage-controlled oscillator needs an amplitude control loop to stabilize the amplitudes of the generated sine waves. This control loop needs a relatively large filter-time constant and thus consumes chip area. On the other hand such control loops easily introduce undesired bouncing effects.

Using a non-linear oscillator may completely eliminate the need for an amplitude control loop. Unfortunately, such a non-linear oscillator introduces an equivalent parasitic shift of the resonance frequency, especially when the Q of the pole is low. Due to this effect, the control signal is not accurately generated anymore and consequently the filter poles are not accurately fixed.

For this reason, it is preferable to use the alternative method to generate the control signal $X_{control}$.

If the time constants in the main filter are no longer a perfect linear scaling of the time constant in the master filter due to parasitic effects, the accuracy of the filter will be adversely affected. Such parasitic effects can be caused by, for example, bias resistors present in the filter, or parasitic capacitors associated with the passive and active components in an IC process.

Only when the parasitic effect results in an equivalent scaling error of the factor $k_{n\_a}$ and/or $k_{n\_b}$ and/or $k_{master\_a}$ and/or $k_{master\_b}$ can it easily be accounted for by adapting the scaling factor to its desired value.

Parasitic effects that cannot be corrected for by adjusting the scaling factors, give rise to inaccurate pole locations of the filter.

In principle this problem can be solved by measuring both the time constants $\tau_{n\_a} = 1/\sigma_n$ and $\tau_{n\_b} = 1/\omega_n$ from each individual filter pole. This can be done by measuring these properties on a master filter, which has to be an exact (scaled) copy of the filter section that realizes a single complex filter pole in the main filter.

Unfortunately this results in an impractical control system where n master-filters are needed to adjust the n poles of the complex filter to their desired positions.

For practical reasons the use of only one master filter is preferred to derive one or two control signals to adjust the pole positions of the main filter.

Since the time constants of the main filter are not perfectly scaled to the time constants of the master filter, errors in the pole positions cannot be avoided.

To sufficiently reduce the error, it is likely that not only the time constant $\tau_{master\_b} = 1/\omega_{master}$ has to be measured to generate the control signal $X_{control}$, but also the time constant $\tau_{master\_a} = 1/\sigma_{master}$ to generate a second control signal $X_{control\_re}$. This control signal is thus associated with the damping of the pole.

Unfortunately, the generation of this second control signal is not very easy to implement, as will be outlined below.

Referring again to the possibilities to generate the control signal $X_{control}$ relating to the frequency of the pole in the master filter, it is now also necessary to include the generation of the control signal $X_{control\_re}$.

As has been discussed previously, it is assumed that the master filter is used as the selective network in a linear oscillator to measure and control the parameter $\tau_{master} = 1/\omega_{master}$. The generation of a second control signal $X_{control\_re}$ implies that an accurate amplitude control loop has to be implemented in the linear oscillator as well. To obtain a good accuracy, the amplitude control loop needs to have a large loop gain, which risks the introduction of bouncing problems. Secondly, an accurate relationship between the loop gain of the oscillator and the signal $X_{control\_re}$ that controls this loop gain has to be established which is not easy to implement.

In the second, preferred, method, in which a signal with an accurate frequency is used to drive the master filter to measure the control variable $X_{control}$ as described above, there is no possibility of measuring the damping of the pole and generating the control signal $X_{control\_re}$.

Methods to derive the two control signals from one master, or even from two master filters, are common practice. Unfortunately, even with the generation of these two control signals there will still be a fundamental error in the positions of the filter poles.

Thus, the present invention aims to eliminate the parasitic paths themselves, thereby overcoming the above-mentioned problems with control signal derivation.

The invention is based on an alternative approach to eliminate the parasitic effects in the filter. In accordance with the invention, a parasitic signal transfer in the signal directed graph of the filter is identified, and this parasitic signal transfer is eliminated, or at least substantially reduced, by adding an inverted signal transfer. Preferably, the parasitic signal transfers of all the filter sections and the master filter are cancelled in this way.

In the following, an ideal signal-directed graph for both a first order and a second order complex filter section will be derived. Without losing generality, the signals in the graph will not be dimensionless but will already be translated into voltages and currents. This representation is used as it can easily be translated in a physical filter structure that uses controllable transconductance amplifiers and fixed capacitor values to form the tuneable time constants in the filter. These types of filters are generally known as $g_mC$ filters.

Secondly, a dominant parasitic path in the signal-directed graph will be shown, followed by the manner in which its influence is eliminated.

Thirdly, the invention will be further illustrated through reference to a preferred embodiment of a $g_mC$ filter in bipolar/MOS technology.

Figure 5:
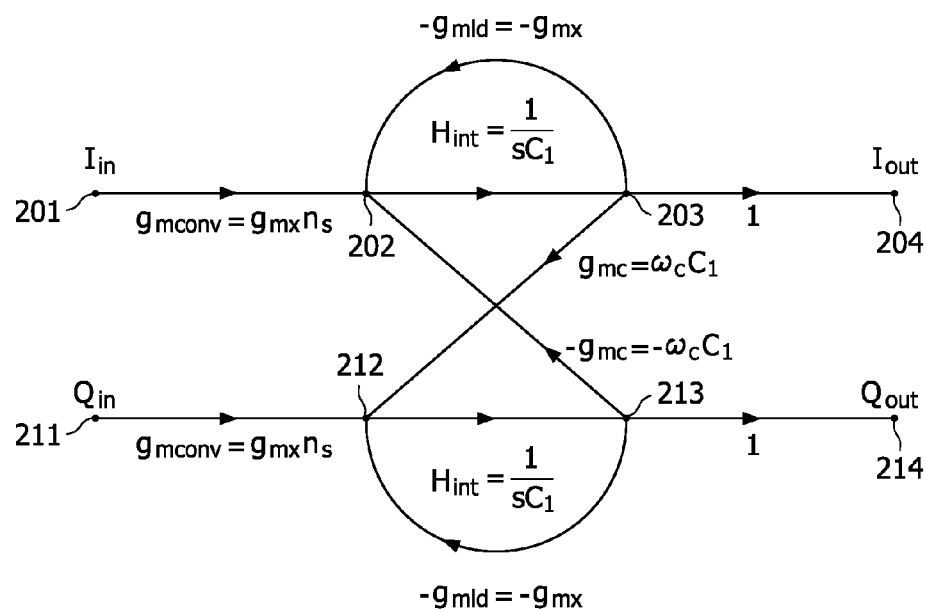
FIG. 5 shows a signal-directed graph of an ideal first-order complex filter.

FIG. 5 shows a signal-directed graph of an ideal first-order complex filter. Such a filter realizes only one complex pole in the s-plane.

The complex input signal of the filter is denoted as:

$$y_{in} = I_{in} + jQ_{in} \quad (5)$$

with the complex output signal as:

$$y_{out} = I_{out} + jQ_{out} \quad (6)$$

where the signals $I_{in}$ and $Q_{in}$ refer to the respective in-phase and quadrature signals present at the inputs to the filter shown in FIG. 5, and the signals $I_{out}$ and $Q_{out}$ refer to the respective in-phase and quadrature signals present at the outputs of the filter.

In FIG. 5, the nodes 201, 202, 203, 204, 211, 212, 213 and 214 represent signals in either the current domain or the voltage domain. Nodes 202, 212 in the graph represent currents, while nodes 201, 211, 203, 213, 204 and 214 represent voltages.

For this reason, all transfer functions shown in the graph are transferring signals from one domain to the other or between two equal domains. For example, $g_{mconv}$ is a transfer function from a voltage node 201 or 211 to a current node 202 or 212 respectively. Since this transfer function is independent of the frequency, it is recognized as a transconductance, generally denoted by the letter g.

In FIG. 5, the only frequency-dependent transfer function is $H_{int} = 1/sC_1$, where s represents the complex frequency and $C_1$ is a constant. $H_{int}$ represents the transfer function from the current domain to the voltage domain of a capacitor with value $C_1$. All transconductances are made controllable by a signal $X_{control}$.

The complex transfer function can be calculated from FIG. 5 and equals:

$$\frac{y_{out}}{y_{in}} = \frac{g_{mx}n_s}{C_1}\left(\frac{1}{s + \frac{g_{mx}}{C_1} - j\omega_c}\right) \quad (7)$$

The complex pole of this filter is thus located at:

$$s_1 = -\left(\frac{g_{mx}}{C_1}\right) + j\omega_c \quad (8)$$

$$\text{where } \omega_c = \frac{g_{mc}}{C_1} \quad (9)$$

The gain of the filter section at $s=j\omega_c$ is given by:

$$\left.\frac{y_{out}}{y_{in}}\right|_{\omega=\omega_c} = n_s \quad (10)$$

It is now assumed that all transconductances are controlled by a control signal $X_{control}$ and are perfectly scaled to each other, which means:

$$g_{mx} = k_{mx}g_{master}X_{control} \quad (11)$$

$$g_{mc} = k_{mc}g_{master}X_{control} \quad (12)$$

All capacitors and transconductances are scaled versions of a master capacitance and a master transconductance. Thus the master resistor and master capacitor are identified as:

$$R_{master} = 1/g_{master} \quad (13)$$

$$C_1 = k_{C1}C_{master} \quad (14)$$

$$\frac{y_{out}}{y_{in}} = \frac{k_{mx}g_{master}n_sX_{control}}{C_1}\left(\frac{1}{s + \left(\frac{k_{mx}g_{master}X_{control}}{C_1}\right) - j\omega_c}\right) \quad (15)$$

resulting in the pole position:

$$s_1 = -\left(\frac{k_{mx}g_{master}X_{control}}{C_1}\right) + j\omega_c \quad (16)$$

where $$\omega_c = \frac{k_{mc}g_{master}X_{control}}{C_1} \quad (17)$$

The gain of the filter section at $s=j\omega_c$ is given by:

$$\left.\frac{y_{out}}{y_{in}}\right|_{\omega=\omega_c} = n_s \quad (18)$$

As outlined before, in this ideal situation, it is only necessary to measure and force $\omega_c$ to be equal to an accurate external reference frequency $\omega_{ref}$ in a master control loop. Assuming that the master-filter is an exact copy of this first order main filter, the generated signal $X_{control}$ equals:

$$X_{control} = \frac{C_1 \omega_{ref}}{k_{mc} g_{master}} \quad (19)$$

resulting in the pole position:

$$s_1 = -\frac{k_{mx}}{k_{mc}} \omega_{ref} + j\omega_{ref} \quad (20)$$

Thus the pole is accurately fixed.

The associated transconductances to be realized are shown in the signal graph diagram of FIG. 5:

$$g_{mconv} = g_{mx} n_s = k_{mx} g_{master} n_s X_{control} \quad (21)$$

$$g_{mld} = g_{mx} = k_{mx} g_{master} X_{control} \quad (22)$$

$$g_{mc} = k_{mc} g_{master} X_{control} \quad (23)$$

Thus the constant $n_s$ represents a scaling factor for scaling the signal levels at each node in the signal graph diagram.

Figure 6:
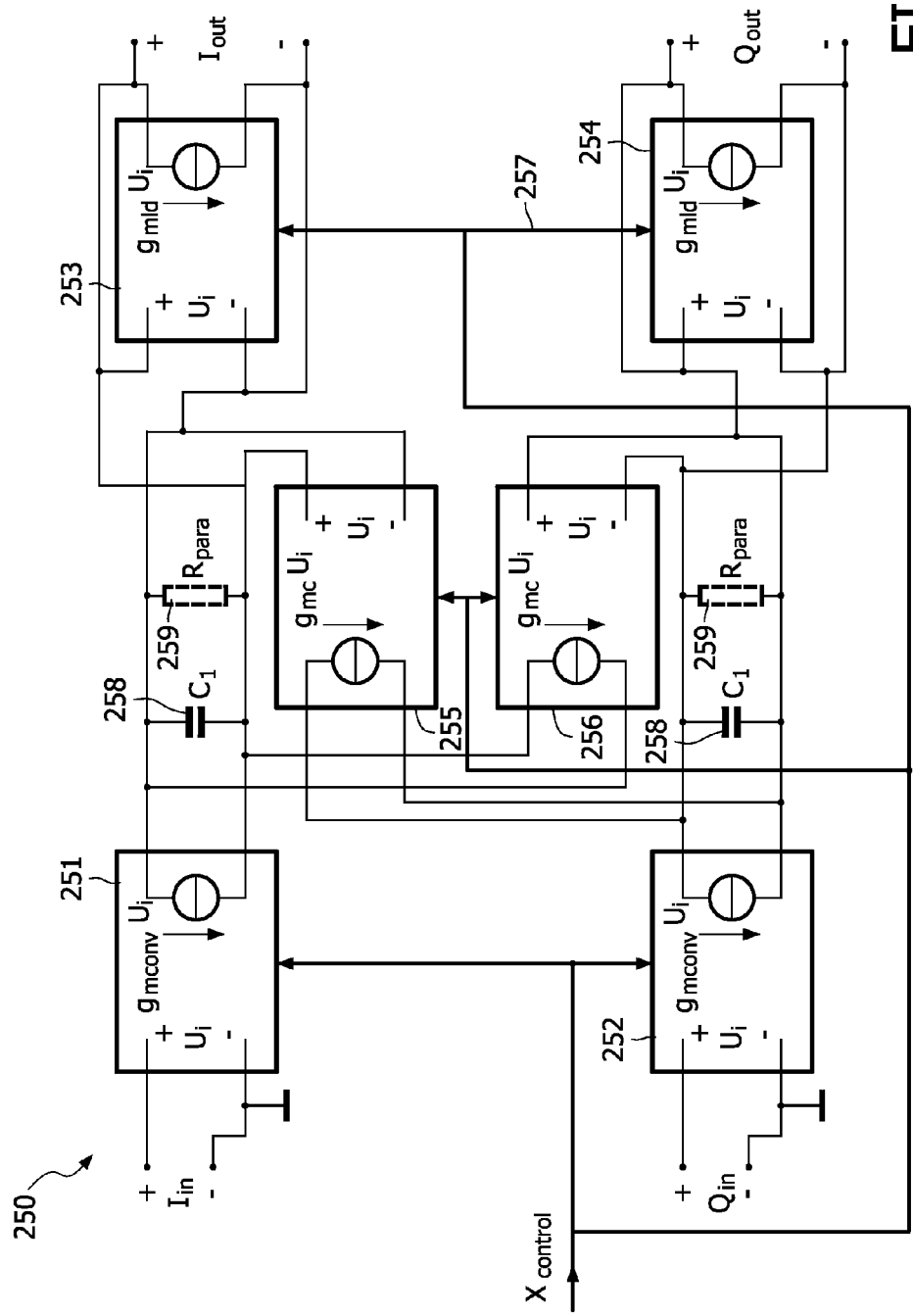
FIG. 6 is a block diagram of a first-order complex filter.

A block diagram of a first-order complex $g_mC$ filter is shown in FIG. 6. This filter is a physical implementation of the signal directed graph shown in FIG. 5.

The filter 250 comprises six transconductance amplifiers 251, 252, 253, 254, 255 and 256. Each transconductance amplifier is supplied with, and therefore controlled by, the control signal $X_{control}$ generated in the master filter over signal line 257. The transfer function $H_{int}$, shown in FIG. 5, is implemented as a capacitor 258 with value $C_1$. All values of the transconductance amplifiers are controlled by the signal $X_{control}$. The resistors 259 with value $R_{para}$ represent an example of parasitic resistance present in the filter 250. In the ideal situation, these resistors 259 have an infinite value. However, in the practical situation, the resistors 259 have finite values.

In situation where the resistors 259 do not have an infinite resistance, there is a parasitic path in the filter 250, which will affect the ideal pole position of the filter 250. This type of parasitic transfer may occur in low-power, low-voltage and low-noise filter designs that use bipolar or MOS differential pair stages (or equivalents such as extended differential pair stages in bipolar circuits, which are the so-called "multitan" stages in bipolar technology) to realize the controllable transconductance amplifier stages.

To bias these transconductance amplifier stages 251, 252, 253, 254, 255 and 256, it is preferable to use bias resistors at the output of each transconductance amplifier stage, which unfortunately result in a parasitic transfer in the filter 250. As outlined above, this parasitic path will adversely affect the accuracy of the filter.

If $$g_{para} = 1/R_{para} \quad (24)$$

then it can be calculated that the transfer function of the filter 250 now becomes:

$$\frac{y_{out}}{y_{in}} = \frac{g_{mx} n_s}{C_1} \left( \frac{1}{s + \left(\frac{g_{mx} + g_{para}}{C_1}\right) - j\omega_c} \right) \quad (25)$$

where $g_{mx}$, $g_{mc}$ and $\omega_c$ are as defined in equations 11, 12 and 17 respectively.

The complex pole of filter 250 is thus located at:

$$s_1 = -\left(\frac{g_{mx} + g_{para}}{C_1}\right) + j\omega_c \quad (26)$$

$$= -\left(\frac{k_{mx} g_{master} X_{control} + g_{para}}{C_1}\right) + j\left(\frac{k_{mc} g_{master} X_{control}}{C_1}\right)$$

Assuming again, that the master filter will force $\omega_c$ to equal $\omega_{ref}$, it is determined that $$s_1 = -\left(\frac{k_{mx}}{k_{mc}} \omega_{ref} + \frac{g_{para}}{C_1}\right) + j\omega_{ref} \quad (27)$$

Thus, if equation 27 is compared to the ideal situation in equation 20, it can be seen that the pole position is no longer accurately fixed, and the real part depends on the value of $g_{para}$ (or $R_{para}$) and $C_1$. However, it can be seen that the imaginary part is still accurate.

Figure 7:
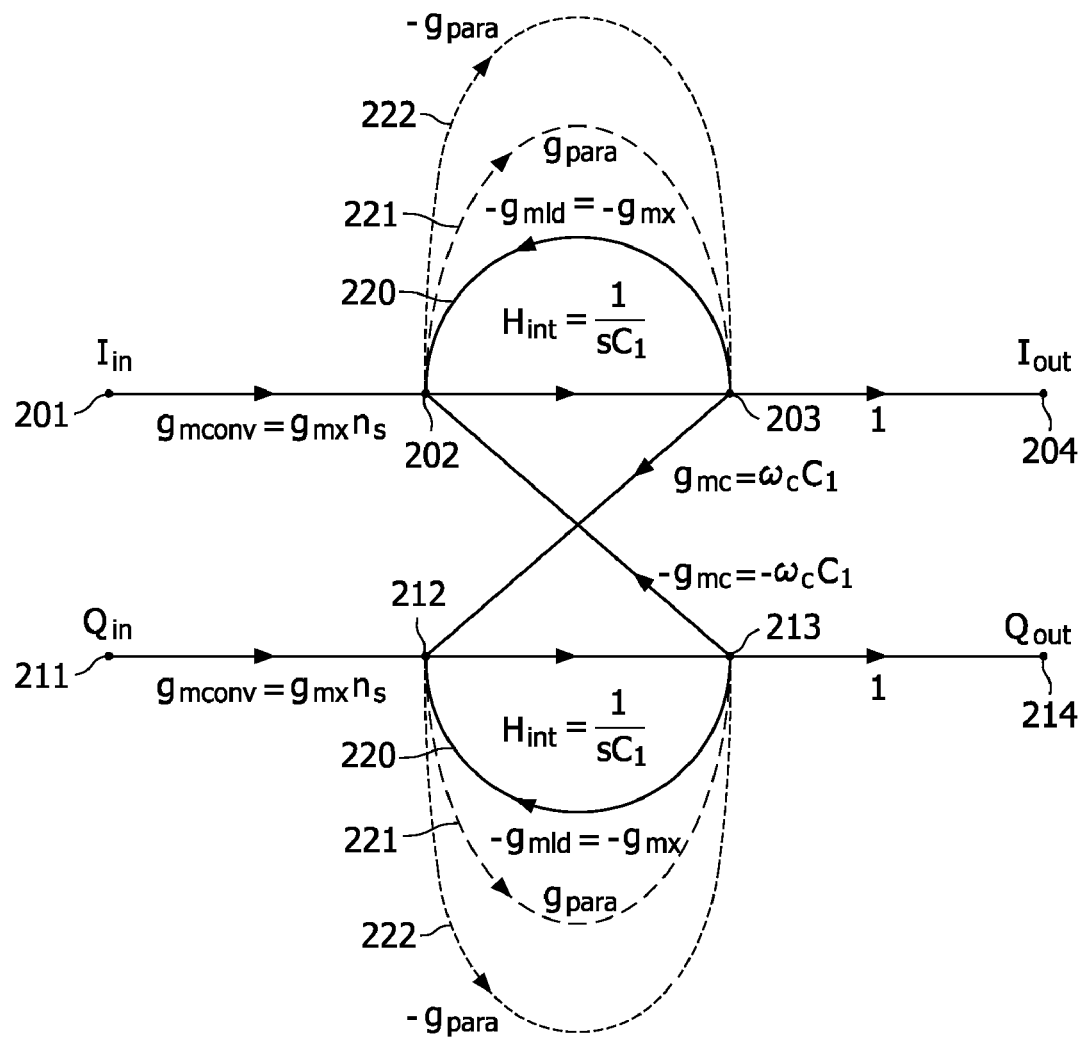
FIG. 7 shows a signal-directed graph of a single pole complex filter with a parasitic path.

FIG. 7 is a signal-directed diagram of a single pole complex filter with a parasitic path. FIG. 7 corresponds substantially to FIG. 5 and the nodes are therefore given the same reference numerals. The parasitic paths caused by the parasitic resistors 259 having values $R_{para}$ (=$1/g_{para}$) are shown as the dashed curves 221 in FIG. 7.

Now that the parasitic paths have been identified, the parasitic paths can be eliminated with parallel paths having opposite signs. These compensating paths are shown as dotted lines 222.

Figure 8:
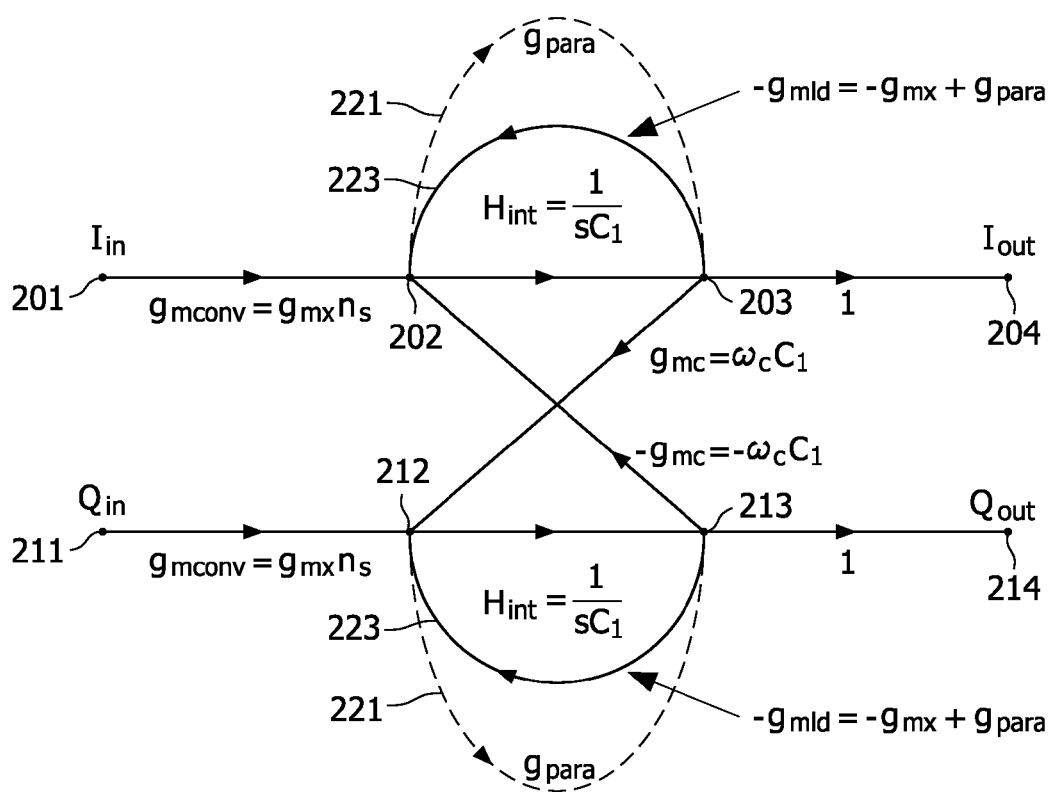
FIG. 8 shows a signal-directed graph of a single pole complex filter with the parasitic paths eliminated.

Although not essential, path 220 and path 222 can be combined together. The resultant signal-directed diagram is shown in FIG. 8. Here, paths 220 and 222 have been combined into path 223.

Once the parasitic path has been eliminated, the filter 250 is considered to be ideal again, and its transfer function is given by equation 15. The master filter will thus accurately fix the pole position.

Figure 9:
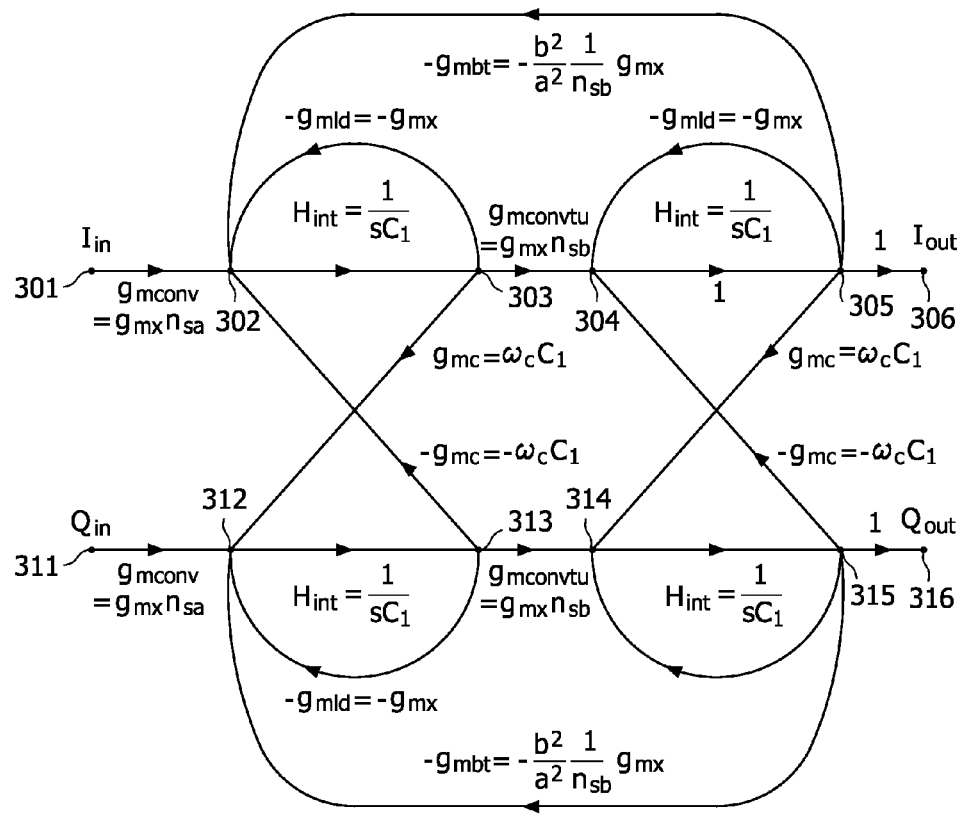
FIG. 9 shows a signal-directed graph of a double pole complex filter.

A second-order complex filter basically comprises two cascaded first-order complex filter sections, with a feedback path applied across them. FIG. 9 shows a signal-directed diagram of an ideal second order complex filter section. As with FIG. 5, the signals $I_{in}$ and $Q_{in}$ refer to the respective in-phase and quadrature signals present at the inputs to the filter, and the signals $I_{out}$ and $Q_{out}$ refer to the respective in-phase and quadrature signals present at the outputs of the filter.

In FIG. 9, the nodes 301, 302, 303, 304, 305, 306, 311, 312, 313, 314, 315 and 316 represent signals in either the current domain or the voltage domain. Nodes 302, 312, 304 and 314 in the graph represent currents, while nodes 301, 311, 303, 313, 305, 315 306 and 316 represent voltages. All transfer functions shown in the graph are transferring signals from one domain to the other or between two equal domains.

Without losing generality, the two first-order sections are selected to be identical, except for the transfers $g_{mconv}$ and $g_{mconvtu}$, which can be selected to be different to allow the appropriate signal levels to be chosen at each node in the filter.

$$\frac{y_{out}}{y_{in}} = \left( \frac{\sqrt{a^2 + 4b^2}}{(s - j\omega_c + a)^2 + b^2} \right) \quad (28)$$

$$= \frac{\sqrt{\frac{g_{mx}}{C_1^2}(g_{mx} + 4g_{mbt}n_{sb})}}{\left(s - j\omega_c + \frac{g_{mx}}{C_1}\right)^2 + \frac{g_{mbt}g_{mx}n_{sb}}{C_1^2}}$$

The two complex poles are given by:

$$s_{1,2} = -a \pm jb + j\omega_c = -\frac{g_{mx}}{C_1} \pm j\frac{1}{C_1}\sqrt{g_{mbt}g_{mx}n_{sb}} + j\omega_c \quad (29)$$

where $$g_{mx} = aC_1 \quad (30)$$

and $$\omega_c = \frac{g_{mc}}{C_1} \quad (31)$$

The gain at the centre frequency amounts to:

$$\left.\frac{y_{out}}{y_{in}}\right|_{\omega=\omega_c} = \sqrt{\frac{a^2 + 4b^2}{a^2 + b^2}} = \frac{g_{mx} + 4g_{mbt}n_{sb}}{g_{mx} + g_{mbt}n_{sb}} \quad (32)$$

This filter can be implemented in a similar way to the first-order filter shown in FIG. 6. However, two sections are now used in cascade, and an overall feedback transconductance is applied.

The parasitic effects present in the filter can be eliminated in the same way as shown for the first-order complex filter in FIGS. 7 and 8, so all of the derived equations for the second-order filter remain valid.

As with the first-order filter, the positions of the poles can be accurately fixed through the use of a master filter. The master filter will be part of a control loop and the time-constant of the master filter will be accurately adjusted with the aid of an accurate reference frequency $\omega_{ref}$. The generated control signal $X_{control}$ is as shown in equation 19. The same control signal can be used to adjust all of the transconductance amplifiers in the second-order complex filter. The controlled transconductances $g_{mbt}$ and $g_{mx}$ are given by:

$$g_{mx} = k_{mx}g_{master}X_{control} \quad (33)$$

$$g_{mbt} = k_{mbt}g_{master}X_{control} \quad (34)$$

Substituting these values and equation 19 into equation 29 results into the position of the poles being given by:

$$s_{1,2} = -\frac{k_{mx}}{k_{mc}}\omega_{ref} + j\omega_{ref}\left(1 \pm \frac{1}{k_{mc}}\sqrt{k_{mbt}k_{mx}n_{sb}}\right) \quad (35)$$

Thus, the poles are again accurately fixed by the control signal from the master-filter loop. This is true in the situations in which all the parasitic paths are eliminated first, just like in the first-order complex filter.

One implementation of the invention will now be described with reference to a bipolar/MOS $g_mC$ filter in which the parasitic paths are eliminated, or substantially reduced.

Essentially, a filter with an arbitrary number of complex pole positions can be built up by cascading a number of first-order complex filter sections. Alternatively, second-order complex filter sections can be used as they are more robust against differences in tolerances between the components of the filter.

In this embodiment, the main filter comprises three complex filter sections arranged in a cascade. The first section comprises a single-pole complex filter, and the second and third sections comprise respective dual-pole complex filters. This arrangement corresponds to the filter described with reference to FIGS. 3 and 4.

In this embodiment, the master filter comprises a single-pole complex filter.

Figure 10:
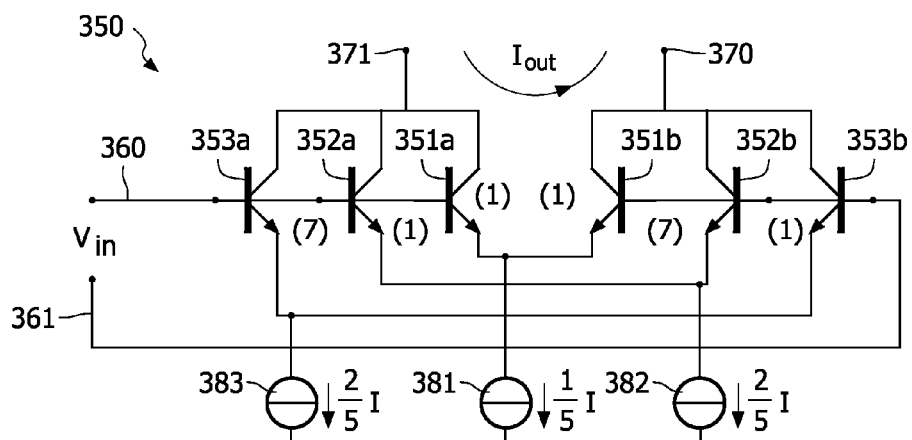
FIG. 10 is a circuit diagram of an exemplary transconductance amplifier.

In this embodiment, the controllable transconductance amplifiers in the filter sections are realized by so-called multitan differential stages, an example of which is illustrated in FIG. 10. The transconductance amplifier 350 comprises three differential transistor pairs, transistors 351a and 351b form the first pair, transistors 352a and 352b form the second pair, and transistors 353a and 353b form the third pair. The relative emitter area ratios are indicated by the numbers between brackets next to the transistors.

Amplifier 350 has a more linear transfer from input voltage $V_{in}$ received on input lines 360, 361 to output current $I_{out}$ output on output lines 370, 371 in comparison to a single differential pair. For this reason, larger input signals can be handled, which therefore increases the dynamic range of the filter 350. Transistors 352b and 353a occupy seven times the area of the other transistors 351a, 351b, 352a and 353b. This area ratio and tail-current ratio results into the best linear transfer from input voltage to output current. The total tail-current I is used to control the value of the transconductance.

The emitters of the transistors 351a and 351b of the first differential pair are connected to a current source 381 that provides a current ⅕I. The emitter of the transistors 352a and 352b of the second differential pair are connected to a current source 382 that provides a current ⅖I. The emitter of the transistors 353a and 353b of the third differential pair are connected to a current source 383 that also provides a current ⅖I.

The transconductance of all multitan amplifiers can generally be written as:

$$g_m = k_{mt}\frac{qI}{kT} \quad (36)$$

where $k_{mt}$ is a constant that depends on the number of multitan stages and the geometry; k is the Boltzmann constant; T is the absolute temperature; and I represents the control current used to adjust the transconductance $g_m$.

The master filter and the master control loop will now be discussed. All values and components having an index: $\_\_\_{master}$ refer to values and components of the master filter. As mentioned above, the master-filter is a first-order complex filter, having a single complex pole. The topology of the master filter is as shown in FIG. 6, although each value and component has an index "$\_\_\_{master}$". For example, the capacitors 258 have the value $C_{1\_master}$, the parasitic resistors 259 have the value $R_{para\_master}$, and the transfer functions are denoted $g_{mconv\_master}$, $g_{mld\_master}$, and $g_{mc\_master}$. The control signal $X_{control}$, which is provided to each of the transconductance amplifiers 251, 252, 253, 254, 255 and 256, is derived from a control loop.

The parasitic resistors 259 will exist in the implementation of the first-order complex filter as a consequence of using bias resistors at the output of the first transconductance amplifiers 251 and 252 respectively.

The transfer function of the master filter corresponds to that given in equation 25. With the correct indexes it results in:

$$\frac{y_{out\_master}}{y_{in\_master}} = \frac{g_{mx\_master} n_{s\_master}}{C_{1\_master}} \left( \frac{1}{s + \left( \frac{g_{mx\_master} + g_{para\_master}}{C_{1\_master}} \right) - j\omega_{c\_master}} \right) \quad (37)$$

where $\omega_{c\_master}$ is as shown in equation 9, and with the correct indexes becomes:

$$\omega_{c\_master} = \frac{g_{mc\_master}}{C_{1\_master}} \quad (38)$$

Now, it is assumed that the multitan transconductance amplifiers 255 and 256 have a transconductance of:

$$g_{mc\_master} = k_{mt} \frac{q}{kT} I_{control} \quad (39)$$

where $I_{control}$ is the control signal (a current) that will also be used to tune the transconductance amplifiers in the main filter; $k_{mt}$ is a constant and will be 5.302961842 for a multitan transconductance amplifier 350 according to FIG. 10.

Figure 11:
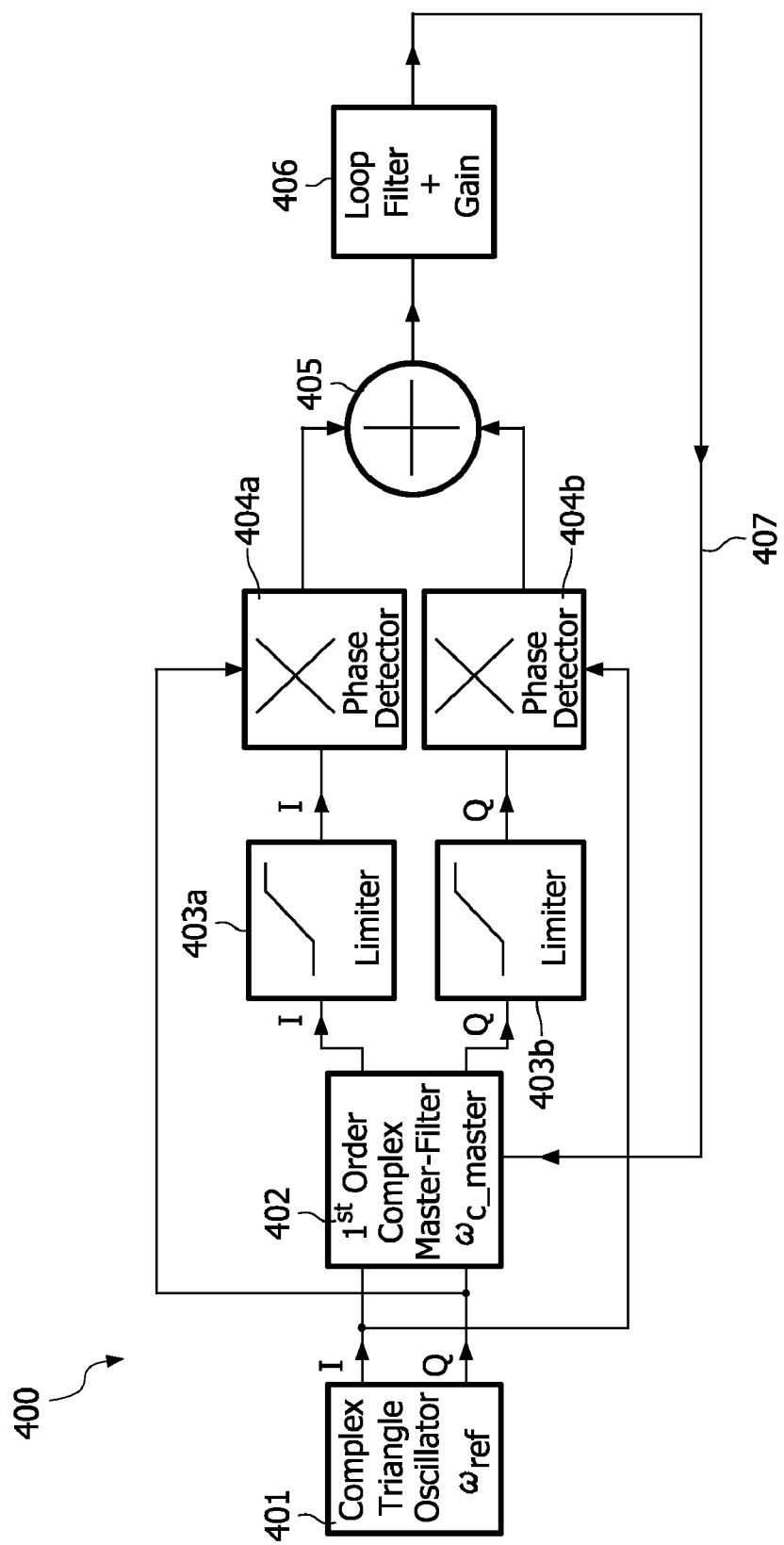
FIG. 11 is a block diagram of a master control loop.

As discussed, the master filter is preferably driven by an external complex oscillator signal with an accurate frequency $\omega_{ref}$ and taken into a phase control loop which nulls the output phase of the master filter with respect to the input phase. This nulling of the phase is achieved by adjusting the control current $I_{control}$. An exemplary control loop is shown in FIG. 11.

In the ideal situation, the master control loop is driven by a complex sine-wave oscillator signal with an accurate frequency $\omega_{ref}$. However, for sake of easy implementation of the oscillator, other waveforms like complex square-waves or complex triangle-waves are preferred. A complex triangle signal is preferred above a complex square-wave signal since the higher harmonics of the reference frequency are more suppressed. The level of certain harmonics should be kept adequately low not to disturb the master control loop.

The master control loop 400 comprises a complex triangle oscillator 401 which generates a complex triangle signal with a frequency $\omega_{ref}$ and passes the complex triangle signal to the first-order complex master filter 402. The in-phase and quadrature components of the signal are passed to respective limiting amplifiers 403a and 403b. The output of the limiting amplifiers 403a and 403b are provided to respective phase detectors 404a and 404b. Each phase detector 404a and 404b also receives a respective copy of the other signal component. For example, phase detector 404a receives a copy of the quadrature signal component from the output of the quadrature triangle oscillator 401, and phase detector 404b receives a copy of the in-phase signal component from the output of the oscillator 401.

The outputs of the phase detectors 404a and 404b are added together in summing block 405 and provided to loop filter and gain block 406. The output of block 406, the $I_{control}$ signal is provided (via line 407) back to the master filter 402, so that $\omega_{c\_master}$ is tuned to $\omega_{ref}$.

Since the output phase of the master filter 402 is not affected by the real part of the complex filter pole and thus not affected by the value of the parasitic resistor, it is not necessary to compensate for this parasitic at all.

Since the phase control loop 400 ensures that $$\omega_{c\_master} = \omega_{ref} \quad (40)$$

The control current generated by the master control loop 400 is given by combining equations 38, 39 and 40, and results in $$I_{control} = \frac{1}{k_{mt}} \left( \frac{kT}{q} \right) \omega_{ref} C_{1\_master} \quad (41)$$

As indicated above, this value is independent of the parasitics.

The transconductances of each transconductance amplifier 251, 252, 253, 254, 255, 256 present in the master filter are controlled by this control signal and are given by $g_{mx\_master}$ which is a scaled copy of $g_{mc\_master}$ and $$g_{mx\_master} = k_m \frac{q}{kT} (k_{mx\_master} I_{control}) \quad (42)$$

where the constant $k_{mx\_master}$ scales the control current $I_{control}$.

All transconductance amplifiers in the main filter will use the same topology as the transconductance amplifiers realized in the master filter 402. The transconductance amplifiers can be bipolar multitan stages as shown in FIG. 10 where the total tail current controls the value of the transconductance.

All transconductances present in the main filter will be scaled versions of this transconductance. This scaling is done by scaling the control currents of the transconductance amplifiers in the main filter.

The outputs of the transconductance stages should ideally be biased with current sources in order not to influence the ideal signal path of the filter.

However, in low-voltage, low-noise applications, these biasing current sources will produce excessive noise.

For this reason, the output collectors of the multitan transconductance stages are biased by resistors at the output to obtain the lowest noise level in the filter.

Unfortunately, these output resistors introduce a parasitic transfer in the signal path of the filter as indicated (for a first order filter section) by the parasitic resistors 259 having values $R_{para}$ in FIG. 6.

As outlined in the general procedure, and in accordance with the invention, the influence of these parasitic resistances is eliminated or substantially reduced by adding a cancelling transconductance.

Assuming that the influence of the parasitic resistances are cancelled out, the ideal filter responses, in which the poles are accurately fixed by an external reference frequency $\omega_{ref}$, should be obtained.

Consider now a first-order complex filter section forming part of the main filter. All specific values and components of the first-order complex filter section are given an index $_{\_s1}$.

The topology of the first-order complex filter section corresponds to that shown in FIG. 6.

As discussed with reference to FIG. 6, the transfer function of a first-order complex filter section 250 is given by equation 25. With the appropriate indexes, the transfer function is given by $$\frac{y_{out\_s1}}{y_{in\_s1}} = \frac{g_{mx\_s1} n_{s\_s1}}{C_{1\_s1}} \left( \frac{1}{s + \left(\frac{g_{mx\_s1} + g_{para\_s1}}{C_{1\_s1}}\right) - j\omega_{c\_s1}} \right) \quad (43)$$

where $\omega_{c\_c1}$ is as shown in equation 9, and with the appropriate indexes becomes $$\omega_{c\_s1} = \frac{g_{mc\_s1}}{C_{1\_s1}} \quad (44)$$

The influence of $g_{para}$ will be cancelled.

All transconductances in the filter 250 are scaled versions of the transconductances present in the master filter. Using equation 39, it is assumed that $$g_{mc\_s1} = k_{mc\_s1} g_{mc\_master} = k_{mt} \frac{q}{kT}(k_{mc\_s1} I_{control}) \quad (45)$$

$$g_{mx\_s1} = k_{mx\_s1} g_{mc\_master} = k_{mt} \frac{q}{kT}(k_{mx\_s1} I_{control}) \quad (46)$$

FIG. 12 shows a first-order complex filter section 500 in accordance with the invention. In this embodiment, the transconductance amplifiers are multitan bipolar transconductance amplifiers with a topology as shown in FIG. 10. The total tail current I of each of these transconductance amplifiers are not equal to each other but are individually scaled with respect to the control current $I_{control}$. The first-order complex filter section 500 corresponds to that shown in FIG. 6 and therefore comprises six transconductance amplifier stages 510, 520, 530, 540, 550, 560. Each of the amplifier stages correspond to an amplifier 350 as shown in FIG. 10.

In order to keep FIG. 12 as simple as possible, amplifier stages 510, 520, 550 and 560 are represented by simple blocks, rather than the full transconductance amplifier shown in FIG. 10. Although each amplifier stage has a respective reference numeral, the inputs of each amplifier stage are labelled 360, 361 and the outputs of each amplifier stage are labelled 370, 371 as in FIG. 10. Each amplifier stage also has an input signal line for receiving a control signal $V_{control}$. This control voltage $V_{control}$ is related to the control current $I_{control}$ in such a way that the total tail current I of each transconductance amplifier is an individual scaled copy of the control current $I_{control}$ derived from the master control loop shown in FIG. 11. The control signal $V_{control}$ is derived from control current $I_{control}$ by circuit 565 that comprises a transistor 567 and a current source 569.

As in FIG. 6, the first transconductance amplifier stage 510 receives the in-phase signal $I_{in}$ at its input lines 360, 361. The output from the first stage 510 (on its respective output signal lines 370, 371) is provided to the inputs 360, 361 respectively of the third amplifier stage 530 and the fifth amplifier stage 550.

The second transconductance amplifier stage 520 receives the quadrature signal $Q_{in}$ at its input lines 360, 361 respectively. The output from the second stage 520 (on its respective signal lines 370, 371) is provided to the inputs 360, 361 respectively of the fourth amplifier stage 540 and sixth amplifier stage 560.

The output signal lines 370, 371 of the fifth amplifier stage 550 are connected to the output signal lines of the second stage 520.

Likewise, the output signal lines 370, 371 of the sixth amplifier stage 560 are connected to the output signal lines of the first stage 510.

The output of the third stage 530 forms the output in-phase signal, $I_{out}$, and the output of the fourth stage 540 forms the output quadrature signal, $Q_{out}$.

Signal line wireA_s1 connects input signal line 360 of the third stage 530 to its own output signal line 371. Signal line wireB_s1 connects input signal line 361 of the third stage 530 to its own output signal line 370. Signal line wireC_s1 connects input signal line 360 of the fourth stage 540 to its own output signal line 371. Signal line wireD_s1 connects input signal line 361 of the fourth stage 540 to its own output signal line 370.

Between the output signal lines 370, 371 of each of the first and second stages 510, 520 are respective capacitors 570 having value $C_{1\_s1}$.

A bias resistor 580 having a value $R_{L\_s1}$ is connected between each of the output signal lines 370, 371 of the first and second amplifier stages 510, 520 and a voltage supply $+V_{cc}$.

In the theoretical situation in which the bias resistors $R_{L\_s1}$ are infinite and the supply voltage is impractically high, there will be no parasitic path having non-linear scaling with the master-filter. In this ideal situation, the transconductances that are realized in the amplifiers are given by equations 21, 22 and 23 and by combining these with equations 41, 45 and 46, the transconductances of the amplifier stages are obtained and shown in Table 1 below.

TABLE 1

| Amplifier stage | Transconductance |
|---|---|
| First | $g_{mconv\_s1} = g_{mx\_s1} n_{s\_s1} = k_{mt}\frac{q}{kT}(n_{s\_s1} k_{mx\_s1} I_{control}) = n_{s\_s1} k_{mx\_s1} \omega_{ref} C_{1\_master}$ |
| Second | $g_{mconv\_s1} = g_{mx\_s1} n_{s\_s1} = k_{mt}\frac{q}{kT}(n_{s\_s1} k_{mx\_s1} I_{control}) = n_{s\_s1} k_{mx\_s1} \omega_{ref} C_{1\_master}$ |
| Third | $g_{mld\_s1} = g_{mx\_s1} = k_{mt}\frac{q}{kT}(k_{mx\_s1} I_{control}) = k_{mx\_s1} \omega_{ref} C_{1\_master}$ |
| Fourth | $g_{mld\_s1} = g_{mx\_s1} = k_{mt}\frac{q}{kT}(k_{mx\_s1} I_{control}) = k_{mx\_s1} \omega_{ref} C_{1\_master}$ |

TABLE 1-continued

| Amplifier stage | Transconductance |
|---|---|
| Fifth | $g_{mc\_s1} = k_{mt} \dfrac{q}{kT}(k_{mc\_s1} I_{control}) = k_{mc\_s1} \omega_{ref} C_{1\_master}$ |
| Sixth | $g_{mc\_s1} = k_{mt} \dfrac{q}{kT}(k_{mc\_s1} I_{control}) = k_{mc\_s1} \omega_{ref} C_{1\_master}$ |

In this filter section 500, the biasing of the outputs of the first, second, fifth and sixth stages of the transconductance amplifiers 510, 520, 550, 560 is realized by the four biasing resistors 580. As explained previously, resistor biasing is preferred in low-voltage applications to obtain the lowest noise level in the filter 500. However, these bias resistors 580 are interfering with the desired signal path of the filter 500.

Thus, according to the invention, this parasitic signal path is first identified in a signal directed graph (for example in FIG. 7) and its influence is cancelled or substantially reduced by adding a parallel parasitic path having an opposite sign in combination with a pre-existing transfer path (for example as shown in FIG. 8).

The value $g_{para\_s1}$ of the parasitic transconductance paths due to the bias resistors 580 is given by $$g_{para\_s1} = \frac{1}{2R_{L\_s1}} \quad (47)$$

In accordance with FIG. 8, this parasitic path is eliminated by modifying the transconductance gain $g_{mld\_s1}$ into $$g_{mldN\_s1} = g_{mx\_s1} - g_{para\_s1} \quad (48)$$

This gain can be obtained by subtracting a compensation current $I_{comp\_s1}$ from the total tail current of the transconductance amplifier $$I_{comp\_s1} = \frac{1}{k_{mt}} \frac{kT}{q} g_{para\_s1} = \frac{1}{k_{mt}} \frac{kT}{q} \left( \frac{1}{2R_{L\_s1}} \right) \quad (49)$$

which gives $$g_{mldN\_s1} = g_{mx\_s1} - g_{para\_s1} = k_{mt} \frac{q}{kT}(k_{mx\_s1} I_{control} - I_{comp\_s1}) \quad (50)$$

Including these compensation currents results in Table 1 above results in the following

TABLE 2

| Amplifier stage | Transconductance |
|---|---|
| First | $g_{mconv\_s1} = g_{mx\_s1} n_{s\_s1} = k_{mt} \dfrac{q}{kT}(n_{s\_s1} k_{mx\_s1} I_{control}) = n_{s\_s1} k_{mx\_s1} \omega_{ref} C_{1\_master}$ |
| Second | $g_{mconv\_s1} = g_{mx\_s1} n_{s\_s1} = k_{mt} \dfrac{q}{kT}(n_{s\_s1} k_{mx\_s1} I_{control}) = n_{s\_s1} k_{mx\_s1} \omega_{ref} C_{1\_master}$ |
| Third | $g_{mldN\_s1} = g_{mx\_s1} = k_{mt} \dfrac{q}{kT}\|(k_{mx\_s1} I_{control} - I_{comp\_s1})\| = \left\| k_{mx\_s1} \omega_{ref} C_{1\_master} - \dfrac{1}{2R_{L\_s1}} \right\|$ |
| Fourth | $g_{mldN\_s1} = g_{mx\_s1} = k_{mt} \dfrac{q}{kT}\|(k_{mx\_s1} I_{control} - I_{comp\_s1})\| = \left\| k_{mx\_s1} \omega_{ref} C_{1\_master} - \dfrac{1}{2R_{L\_s1}} \right\|$ |
| Fifth | $g_{mc\_s1} = k_{mt} \dfrac{q}{kT}(k_{mc\_s1} I_{control}) = k_{mc\_s1} \omega_{ref} C_{1\_master}$ |
| Sixth | $g_{mc\_s1} = k_{mt} \dfrac{q}{kT}(k_{mc\_s1} I_{control}) = k_{mc\_s1} \omega_{ref} C_{1\_master}$ |

This compensation current can be easily implemented by forcing a voltage that is proportional to absolute temperature (PTAT) across a resistor. The current through the resistor can thus be used to compensate for the influence of the bias resistors 580 on the signal transfer through the filter 500.

One implementation of this compensation in accordance with the invention is shown in FIG. 12. The total tail current of each transconductance amplifier stage is controlled by an individually scaled copy of the control current $I_{control}$. This is realized by feeding the control current $I_{control}$ into an MOS device with a reference device area $A_{E\_master}$ as indicated in FIG. 12 by the number between square brackets. The total device area of the MOS tail current sources in each individual transconductance amplifier, indicated in FIG. 12 by [AE1], [AE2], [AE3], [AE4], [AE5] and [AE6], are scaled with respect to the device area $A_{E\_mast}$ as:

$$A_{E1} = k_{mx\_s1} n_{s\_s1} A_{E\_master} \quad (50b)$$

$$A_{E2} = k_{mx\_s1} n_{s\_s1} A_{E\_master} \quad (50c)$$

$$A_{E3} = k_{mx\_s1} A_{E\_master} \quad (50d)$$

$$A_{E4} = k_{mx\_s1} A_{E\_master} \quad (50e)$$

$$A_{E5}=k_{mc\_s1}A_{E\_master} \quad (50\text{f})$$

$$A_{E6}=k_{mc\_s1}A_{E\_master} \quad (50\text{g})$$

In particular, a compensation block 585 is provided for each of the third and fourth amplifier stages 530, 540. Each block comprises three transistors 586a, 586b and 586c, with the gates of the transistors 586 being connected to a common gate signal, the sources being connected to a supply voltage +V$_{cc}$, and the drains being connected to the emitters of a respective one of the differential pairs of transistors in the third or fourth amplifier stage 530, 540.

The gate signal for the transistors 586 in each of the blocks 585 is provided by block 587. Block 587 comprises a further transistor 588 whose gate provides the gate signal. The source of the further transistor 588 is connected to the voltage supply +V$_{cc}$, while the drain of the further transistor 588 is connected to the collector of a transistor 589. The gate and drain of the transistor 588 are connected together. The base of the transistor 589 is connected to a bandgap voltage V$_{bandgap}$, and the emitter of the transistor 589 is connected to ground via a resistor 590, having value R$_{ptat\_s1}$.

The voltage across the resistor R$_{ptat\_s1}$ is equal to m$_{bg}$(kT/q), where T represents the absolute temperature, k the Boltzmann constant, q the charge of an electron and m$_{bg}$ a constant directly related to the IC process. This constant will be in the order of 16.

Preferably, the value of resistor 590, R$_{ptat\_s1}$=2m$_{bg}$k$_{mt}$R$_{L\_s1}$. The current through the transistor 589 is denoted I$_{ptat\_s1}$ and thus equals I$_{ptat\_s1}$=kT/(q(2k$_{mt}$R$_{L\_s1}$)). The current is thus linearly related to the absolute temperature (PTAT current).

Particular care has to be taken with the sign of the value of k$_{mx\_s1}$I$_{control}$−I$_{comp\_s1}$. If the sign is positive, the compensation current must be subtracted from the scaled control current and the third and fourth amplifier stages 530, 540 are connected as shown in FIG. 12.

However, if the sign is negative, it is necessary to subtract the current k$_{mx\_s1}$I$_{control}$ from the compensation current I$_{comp\_s1}$ to obtain a positive tail current for the transconductance amplifier stages 530, 540. However, it is now necessary to invert the transfer function g$_{mldN\_s1}$ into −g$_{mldN\_s1}$ to keep the appropriate sign for the transfer function.

This embodiment is illustrated in FIG. 13. The filter section 600 in FIG. 13 corresponds to the filter 500 shown in FIG. 12, except as described below.

First, second, fifth and sixth amplifier stages 610, 620, 650 and 660 receive control signal V$_{control}$ that is derived from I$_{control}$ in a similar way to that shown in FIG. 12. The third and fourth amplifier stages 630 and 640 receive a control signal V$_{controlB}$ that is derived from current I$_{ptat\_s1}$ by circuit 665. Compensation blocks 585 receive a control signal V$_{controlA}$ that is derived from current I$_{control}$ by circuit 667.

The MOS current sources connected to the emitters of the multitan transistors in the blocks 630 and 640 respectively draw a total current of I$_{ptat\_s1}$=kT/(q(2k$_{mt}$R$_{L\_s1}$))=I$_{comp\_s1}$.

The total current drawn by the MOS current sources in block 585 equals k$_{mx\_s1}$I$_{control}$. This current is subtracted from the MOS current sources present in block 630 and 640 and thus the total tail current of the transconductance amplifier in block 630 and 640 respectively now amounts to I$_{comp\_s1}$−k$_{mx\_s1}$I$_{control}$, having now a positive sign.

This desired result is achieved by appropriate scaling of the transistor areas as indicated between square brackets in FIG. 13:

$$A_{E1}=k_{mx\_s1}n_{s\_s1}A_{E\_master} \quad (50\text{h})$$

$$A_{E2}=k_{mx\_s1}n_{s\_s1}A_{E\_master} \quad (50\text{i})$$

$$A_{E3}=A_{E10} \quad (50\text{j})$$

$$A_{E4}=A_{E10} \quad (50\text{k})$$

$$A_{E5}=k_{mc\_s1}A_{E\_master} \quad (50\text{l})$$

$$A_{E6}=k_{mc\_s1}A_{E\_master} \quad (50\text{m})$$

$$A_{E7}=A_{E9} \quad (50\text{n})$$

$$A_{E8}=A_{E9} \quad (50\text{p})$$

$$A_{E11}=k_{mx\_s1}A_{E\_master} \quad (50\text{q})$$

The inversion of the signal path is carried out by swapping the positive and negative inputs of the third and fourth transconductance amplifiers of FIG. 12, which means that the connections of the signal lines wireA_s1, wireB_s1, wireC_s1 and wireD_s1 are changed.

Thus, signal line wireA_s1 connects input signal line 360 of the third stage 630 to its own output signal line 370. Signal line wireB_s1 connects input signal line 361 of the third stage 630 to its own output signal line 371. Signal line wireC_s1 connects input signal line 360 of the fourth stage 640 to its own output signal line 370. Signal line wireD_s1 connects input signal line 361 of the fourth stage 640 to its own output signal line 371.

Clearly, the sign of k$_{mx\_s1}$I$_{control}$−I$_{comp\_s1}$ is not allowed to change due to temperature variations or parameter value variations. These changes can be prevented by an appropriate choice of the value R$_{L\_s1}$ of resistor 590.

The transfer function of this filter section 500 or 600, including the appropriate parasitic path elimination, is given by $$\frac{y_{out\_s1}}{y_{in\_s1}} = \frac{g_{mx\_s1}n_{s\_s1}}{C_{1\_s1}}\left(\frac{1}{s+\left(\frac{g_{mx\_s1}}{C_{1\_s1}}\right)-j\omega_{c\_s1}}\right) \quad (51)$$

The complex pole position is given by $$s_1 = -\frac{k_{mx\_s1}}{k_{mc\_s1}}\omega_{ref}+j\omega_{ref} \quad (52)$$

The transfer at the centre frequency ω=ω$_{ref}$ is given by $$\left.\frac{y_{out}}{y_{in}}\right|_{\omega=\omega_{ref}} = n_{s\_s1} \quad (53)$$

The current needed to eliminate the influence of the bias resistors 580 having value R$_{L\_s1}$ on the filter transfer is $$I_{comp\_s1} = \frac{1}{k_{mt}}\frac{kT}{q}\left(\frac{1}{2R_{L\_s1}}\right) \quad (54)$$

The tail currents needed in each amplifier stage are shown in Table 3 below.

TABLE 3

| Amplifier stage | Tail current needed in stage |
| --- | --- |
| First | $n_{s\_s1}k_{mx\_s1}l_{control}$ |
| Second | $n_{s\_s1}k_{mx\_s1}l_{control}$ |
| Third | $|(k_{mx\_s1}l_{control} - l_{comp\_s1})|$ |
| Fourth | $|(k_{mx\_s1}l_{control} - l_{comp\_s1})|$ |
| Fifth | $k_{mc\_s1}l_{control}$ |
| Sixth | $k_{mc\_s1}l_{control}$ |

As evident from equation 52, the pole position is accurately fixed. The precise location will be fixed by choosing appropriate values for the non-varying parameters. The transfer gain and the signal levels in the filter are fixed with the parameter $n_{s\_s1}$.

Consider now a second-order complex filter section forming part of the main filter. All specific values and components of the second-order complex filter section are given an index $_{\_s2}$ for components that were not present in a first-order complex filter, $_{\_s2a}$ and $_{\_s2b}$ for components in the $2^{nd}$ order complex filter stages that were also present in the $1^{st}$ order complex filter stages.

The basic function of the second-order complex filter section has already been described above with reference to FIG. 9 and to FIGS. 12 and 13 for a $1^{st}$ order complex filter.

As in the first-order complex filter section, parasitic paths exist in the second-order complex filter section due to the bias resistors at the outputs of the transconductance amplifier stages. The elimination of the influence of these parasitic effects is achieved in a similar way as described above for the first-order complex filter section.

Assuming that, according to the invention, all parasitic paths in the filter section are eliminated, the transfer function and pole positions are given by equation 28, 29, 30, 31 and 32. The same control current $I_{control}$, used to tune the first-order complex filter section, is also used to tune the second-order complex filter section.

For completeness, FIGS. 14a and 14b show an implementation of a second-order complex filter section 700 in bipolar/MOS technology in accordance with the invention.

For ease of illustration, the second-order filter section shown in FIG. 14 has been split on to two separate sheets.

FIG. 14a shows the amplifier stages present in the first complex filter stage of the $2^{nd}$ order complex filter. These amplifier stages and the other components correspond to those shown in FIG. 12 for the first-order complex filter section 500, except as described below. FIG. 14b shows the amplifier stages present in the second complex filter stage of the $2^{nd}$ order complex filter. Again, these elements correspond to those shown in FIG. 12 for the first-order complex filter section 500, except as described below.

In FIG. 14a, elements that are in common with those shown in the first-order complex filter section of FIG. 12 are given reference numerals that begin 7xx, rather than 5xx. Thus, the six transconductance amplifier stages in FIG. 14a are numbered 710, 720, 730, 740, 750 and 760 respectively, and correspond to amplifier stages 510, 520, 530, 540, 550 and 560 in FIG. 12 respectively.

As mentioned above, the values and components of the second-order complex filter section 700 are given an index $_{\_s2a}$ for components present in the first complex filter stage of the $2^{nd}$ order complex filter. Thus, capacitors 770 have value $C_{1\_s2a}$, resistors 780 have value $R_{L\_s2a}$, transistor 789 has a collector current $I_{ptat\_s2a}$ and resistor 790 has a value $R_{ptat\_s2a}$. The transconductances shown in Tables 1 and 2 above are also changed in a corresponding manner.

In FIG. 14b, elements that are in common with those shown in the first-order complex filter section of FIG. 12 are given reference numerals that begin 8xx, rather than 5xx. Thus, the six transconductance amplifier stages in FIG. 14b are numbered 810, 820, 830, 840, 850 and 860 respectively, and correspond to amplifier stages 510, 520, 530, 540, 550 and 560 in FIG. 12 respectively.

As mentioned above, the values and components of the second-order complex filter section 700 are given an index $_{\_s2b}$ for components present in the second complex filter stage of the $2^{nd}$ order complex filter. Thus, capacitors 870 have value $C_{1\_s2b}$, resistors 880 have value $R_{L\_s2b}$, transistor 889 has a collector current $I_{ptat\_s2b}$ and resistor 890 has value $R_{ptat\_s2b}$. The transconductances shown in Tables 1 and 2 above are also changed in a corresponding manner.

Thus, in the second-order filter section 700, the outputs 370, 371 of the third amplifier stage 730 in FIG. 14a provide the input signals for the first amplifier stage 810 in FIG. 14b. Likewise, the outputs 370, 371 of the fourth amplifier stage 740 in FIG. 14a provide the input signals for the second amplifier stage 820 in FIG. 14b.

The second-order complex filter section 700 further comprises seventh and eighth transconductance stages 910, 920. The input lines 360, 361 of the seventh amplifier stage 910 are connected to the output lines 370, 371 of the third amplifier stage 830 in FIG. 14b. The output lines 370, 371 of the seventh amplifier stage 910 are connected to the output lines 370, 371 of the first amplifier stage 710. The input lines 360, 361 of the eighth amplifier stage 920 are connected to the output lines 370, 371 of the fourth amplifier stage 840 in FIG. 14b. The output lines 370, 371 of the eighth amplifier stage 920 are connected to the output lines 370, 371 of the second amplifier stage 720.

The seventh and eighth amplifier stages 910, 920 have transconductances given by $$k_{mbt\_s2}\omega_{ref}C_{1\_master} \tag{55}$$

This is obtained with a total emitter area of the transistors generating the tail current in each of these amplifier stages 910 and 920, given by:

$$A_{E7}=A_{E8}=k_{mbt\_s2}A_{E\_master} \tag{56}$$

Thus, as each of the third and fourth amplifier stages 730, 740, 830, 840 in the second-order filter section 700 are connected to a respective compensation block 785 or 885, the parasitic effects due to the load resistors at the outputs of the transconductance amplifiers are thus cancelled.

As described above, a main filter can comprise a single first-order complex filter section, and two second-order complex filter sections. The two second-order complex filter sections will each generate two complex poles in different positions. The only differences between the two sections will be the values of the parameters that determine the exact location of the poles.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A radio receiver comprising:
    an initial filter for receiving and filtering in-phase and quadrature signals;
    an amplifier for receiving and amplifying one of said filtered in-phase and quadrature signals; and
    at least one filter for receiving the amplified and filtered in-phase or quadrature signal from said amplifier, regenerating the other one of said in-phase and quadrature signals from said amplified signal, and removing higher harmonics from both the received signal and the regenerated signal.

2. The radio receiver as claimed in claim 1, wherein the at least one filter comprises a second filter.

3. The radio receiver as claimed in claim 2, wherein the second filter is a complex filter.

4. A radio receiver comprising:
    an initial filter for receiving and filtering in-phase and quadrature signals;
    an amplifier for receiving and amplifying one of said filtered in-phase and quadrature signals; and
    a complex filter adapted to receive the amplified signal at a first input and a copy of the amplified signal multiplied by $-\frac{1}{4}$ at a second input.

5. The radio receiver as claimed in claim 1, wherein the amplifier is a limiting amplifier.

6. The radio receiver as claimed in claim 1, further comprising:
    a complex demodulator for receiving the amplified signal and the regenerated signal, and for demodulating the received signals to obtain an information signal.

7. A method of processing an IF signal, the method comprising:
    receiving and filtering in-phase and quadrature signals;
    amplifying one of said filtered in-phase and quadrature signals while terminating the other one of said filtered in-phase and quadrature signals;
    regenerating the other one of said filtered signals from the amplified signal; and
    removing higher harmonics from both the received signal and the regenerated signal.

* * * * *